(12) United States Patent
Fujiwara

(10) Patent No.: US 9,171,595 B2
(45) Date of Patent: Oct. 27, 2015

(54) SEMICONDUCTOR DEVICE INCLUDING NEGATIVE BIAS VOLTAGE GENERATION CIRCUIT

(71) Applicant: RENESAS ELECTRONICS CORPORATION, Kawasaki-shi, Kanagawa (JP)

(72) Inventor: Hidehiro Fujiwara, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 147 days.

(21) Appl. No.: 13/935,815

(22) Filed: Jul. 5, 2013

(65) Prior Publication Data

US 2014/0010027 A1    Jan. 9, 2014

(30) Foreign Application Priority Data

Jul. 6, 2012  (JP) ................. 2012-152502

(51) Int. Cl.
*G11C 7/12* (2006.01)
*G11C 11/41* (2006.01)
*G11C 11/4074* (2006.01)
*G11C 11/419* (2006.01)

(52) U.S. Cl.
CPC .............. *G11C 7/12* (2013.01); *G11C 11/4074* (2013.01); *G11C 11/41* (2013.01); *G11C 11/419* (2013.01)

(58) Field of Classification Search
CPC .... G11C 11/419; G11C 11/412; G11C 5/145; G11C 7/12; G11C 11/41
USPC ........................................ 365/189.09, 210.12
See application file for complete search history.

(56) References Cited

U.S. PATENT DOCUMENTS

| | | | |
|---|---|---|---|
| 7,379,354 B2 * | 5/2008 | Heinrich-Barna et al. | 365/189.16 |
| 8,164,934 B2 * | 4/2012 | Watanabe et al. | 365/49.17 |
| 8,908,418 B2 * | 12/2014 | Yabuuchi | 365/154 |
| 2007/0211545 A1 * | 9/2007 | Otsuka et al. | 365/189.09 |
| 2010/0232244 A1 | 9/2010 | Hirabayashi | |
| 2013/0077387 A1 * | 3/2013 | Yabuuchi | 365/154 |

FOREIGN PATENT DOCUMENTS

JP   2009-295246 A   12/2009
JP   2010-218617 A    9/2010

OTHER PUBLICATIONS

Nobutaro Shibata et al. "A 0.5-V 25-MHZ 1-mW 256-Kb MTCMOS/SOI SRAM for Solar-Power-Operated Portable Personal Digital Equipment-Sure Write Operation by Using Step-Down Negatively Overdriven Bitline Scheme", IEEE Journal of Solid-State Circuits, Mar. 2006, pp. 728 to 742, vol. 41, No. 3.

Yuki Fujimura et al., "A Configurable SRAM with Constant-Negative-Level Write Buffer for Low-Voltage Operation with 0.149 um2 Cell in 32 nm High-K Metal Gate CMOS", 2010 IEEE International Sold-State Circuits Conference, Feb. 10, 2010, pp. 348 to 349.

* cited by examiner

*Primary Examiner* — Son Dinh
*Assistant Examiner* — Jerome LeBoeuf
(74) *Attorney, Agent, or Firm* — Sughrue Mion, PLLC

(57) ABSTRACT

A semiconductor device includes a bit line connected to memory cells, a negative bias voltage generation circuit generating a negative bias voltage that is to be applied to the bit line during writing, and a negative bias reference voltage generation unit generating a negative bias reference voltage based on a resistance ratio between a first resistor and a second resistor.

15 Claims, 16 Drawing Sheets

SEMICONDUCTOR DEVICE INCLUDING NEGATIVE BIAS VOLTAGE GENERATION CIRCUIT

BACKGROUND OF THE INVENTION

1. Field of the Invention

The present invention relates to a semiconductor device, and, for example, to a semiconductor device that writes data into a memory cell in a negative bit line scheme.

2. Description of the Background Art

As the technology node has been developed, characteristic variations of a MOS (Metal-Oxide-Semiconductor) transistor (hereinafter referred to as a transistor) have also been increasing accordingly. These characteristic variations also occur in the single chip (local variations), which causes a decrease in the operation margin of an SRAM (Static Random Access Memory), thereby making it difficult to achieve lowered operation voltage.

As a method of improving the writing operation margin of the SRAM, there have been several proposals including a scheme of lowering the power supply voltage that is to be supplied to memory cells in a write selection column (a memory cell power supply voltage lowering scheme), and a scheme of applying a negative voltage to a bit line on the low-level side among the bit line pairs in the write selection column (a negative bit line scheme).

In the memory cell power supply voltage lowering scheme, the load capacitance of the memory cell power supply (a diffusion capacitance, a gate capacitance and an interconnection capacitance) is relatively large, which lengthen the time required to lower the power supply voltage in the write selection column to a desired value. This arouses concern about an adverse influence on the cycle time in the case of the memory cell power supply voltage lowering scheme. Furthermore, in the case where the memory cell power supply voltage lowering scheme is applied to a multi-port SRAM, when different line access to the same column occurs (read access by activating a read word line and write access by activating a write word line simultaneously occur in the same column), there occurs a problem that the read margin for the read access line cannot be ensured due to power-down of the memory cell power supply.

As a negative bit line scheme, various configurations are disclosed. Japanese Patent Laying-Open No. 2009-295246 discloses a configuration in which a bit line potential on the low-level side among bit line pairs is detected, and when the bit line potential on the low-level side is lowered to a prescribed value, the negative voltage generated in a negative voltage generation circuit is applied to this bit line on the low-level side. In Japanese Patent Laying-Open No. 2010-218617, and "A Configurable SRAM with Constant-Negative-Level Write Buffer for Low-Voltage Operation with 0.149 µm² Cell in 32 nm High-k Metal-Gate CMOS" (ISSCC 2010/SESSION 19/HIGH-PERFORMANCE EMBEDDED MEMORY/19.4, pp. 348 to 349) by Yuki Fujimura, Osamu Hirabayashi, Takahiko Sasaki, Azuma Suzuki, Atsushi Kawasumi, Yasuhisa Takeyama, Keiichi Kushida, Gou Fukano, Akira Katayama, Yusuke Niki, and Tomoaki Yabe, a bootstrap circuit is disclosed in which, when the potential on the replica bit line having the same capacitance as that on the bit line reaches a prescribed value, the bit line driven to a ground voltage is driven to a negative voltage in a prescribed timing. In "A 0.5-V 25-MHz 1-mW 256-Kb MTCMOS/SOI SRAM for Solar-Power-Operated Portable Personal Digital Equipment-Sure Write Operation by Using Step-Down Negatively Overdriven Bitline Scheme" (IEEE JOURNAL OF SOLID-STATE CIRCUITS, VOL. 41, NO. 3, MARCH 2006, pp. 728 to 742) by Nobutaro Shibata, Hiroshi Kiya, Shigehiro Kurita, Hidetaka Okamoto, Masa'aki Tan'no, and Takakuni Douseki, a negative voltage generation circuit is disclosed in which a negative voltage is overdriven onto a bit line for a prescribed time period.

SUMMARY OF THE INVENTION

A semiconductor device according to an embodiment includes a first memory macro having memory cells arranged in a first number of rows; and a second memory macro having memory cells arranged in a second number of rows. The first memory macro includes a first bit line connected to the memory cells, a first negative bias voltage generation circuit generating a first negative bias voltage that is to be applied to the first bit line during writing, and a first negative bias reference voltage generation unit. The second memory macro includes a second bit line connected to the memory cells, a second negative bias voltage generation circuit generating a second negative bias voltage that is to be applied to the second bit line during writing, and a second negative bias reference voltage generation unit. The first negative bias reference voltage generation unit generates a first negative bias reference voltage based on a first resistance ratio between a first resistor and a second resistor, and outputs the first negative bias reference voltage to a first negative bias reference interconnection. The second negative bias reference voltage generation unit generates a second negative bias reference voltage based on a second resistance ratio between a third resistor and a fourth resistor, and outputs the second negative bias reference voltage to a second negative bias reference interconnection. The first negative bias voltage generation circuit generates the first negative bias voltage based on the first negative bias reference voltage. The second negative bias voltage generation circuit generates the second negative bias voltage based on the second negative bias reference voltage. The first resistance ratio is different from the second resistance ratio.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
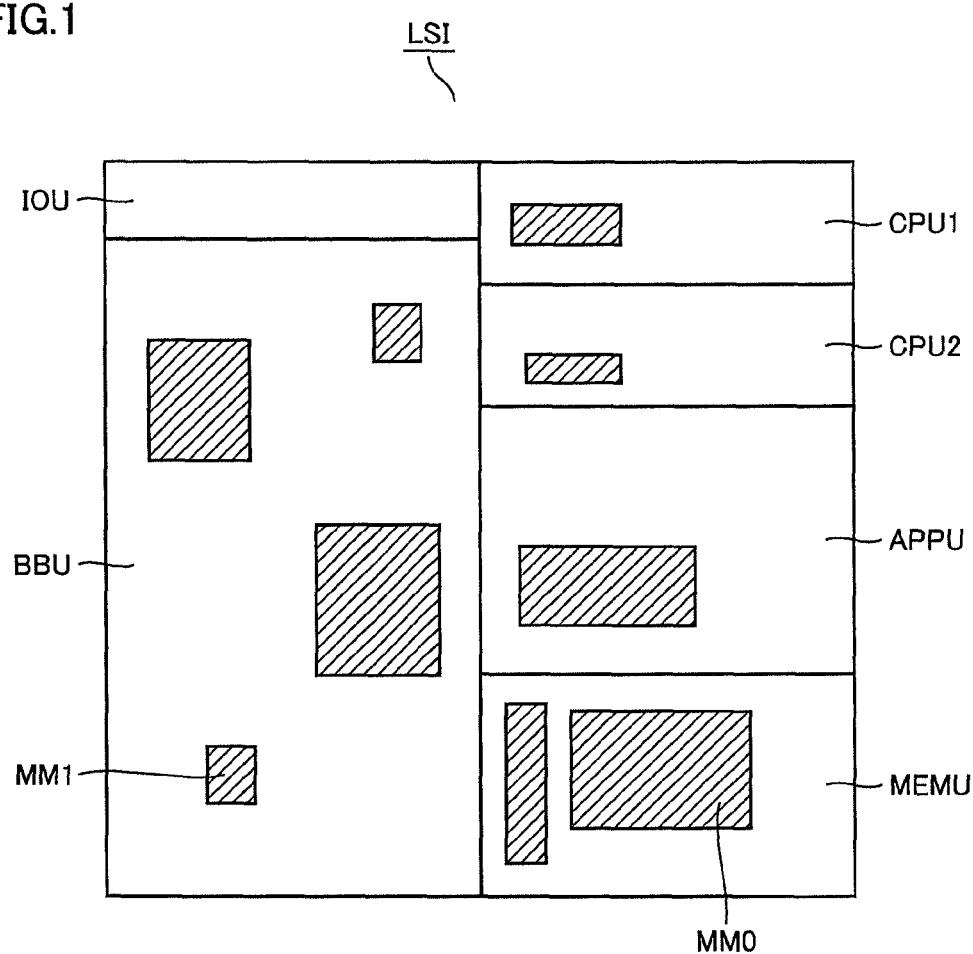
FIG. 1 is a configuration diagram of a semiconductor device according to the first embodiment.

The embodiments of the present invention will be hereinafter described with reference to the accompanying drawings. In the description of the embodiments, when the number, the quantity and the like are mentioned, the scope of the present invention is not necessarily limited thereto unless otherwise specified. In the accompanying drawings of the embodiments, the same or corresponding components are designated by the same reference characters. In the description of the embodiments, the same components are designated by the same reference characters, and description thereof may not be repeated.

<First Embodiment>

Referring to FIG. 1, the configuration of a semiconductor device LSI according to the first embodiment will be described.

Semiconductor device LSI includes a central processing unit CPU1, a central processing unit CPU2, specific functional circuit blocks APPU, BBU and MEMU, and an I/O unit IOU. Each of the central processing units and the specific functional circuit blocks has one or more rectangle-shaped memory macros that are shaded in the figure. For example, specific functional circuit block MEMU has a memory macro MM0, and specific functional circuit block BBU has a memory macro MM1. Data is written into a memory cell of each memory macro in a negative bit line scheme.

Figure 2:
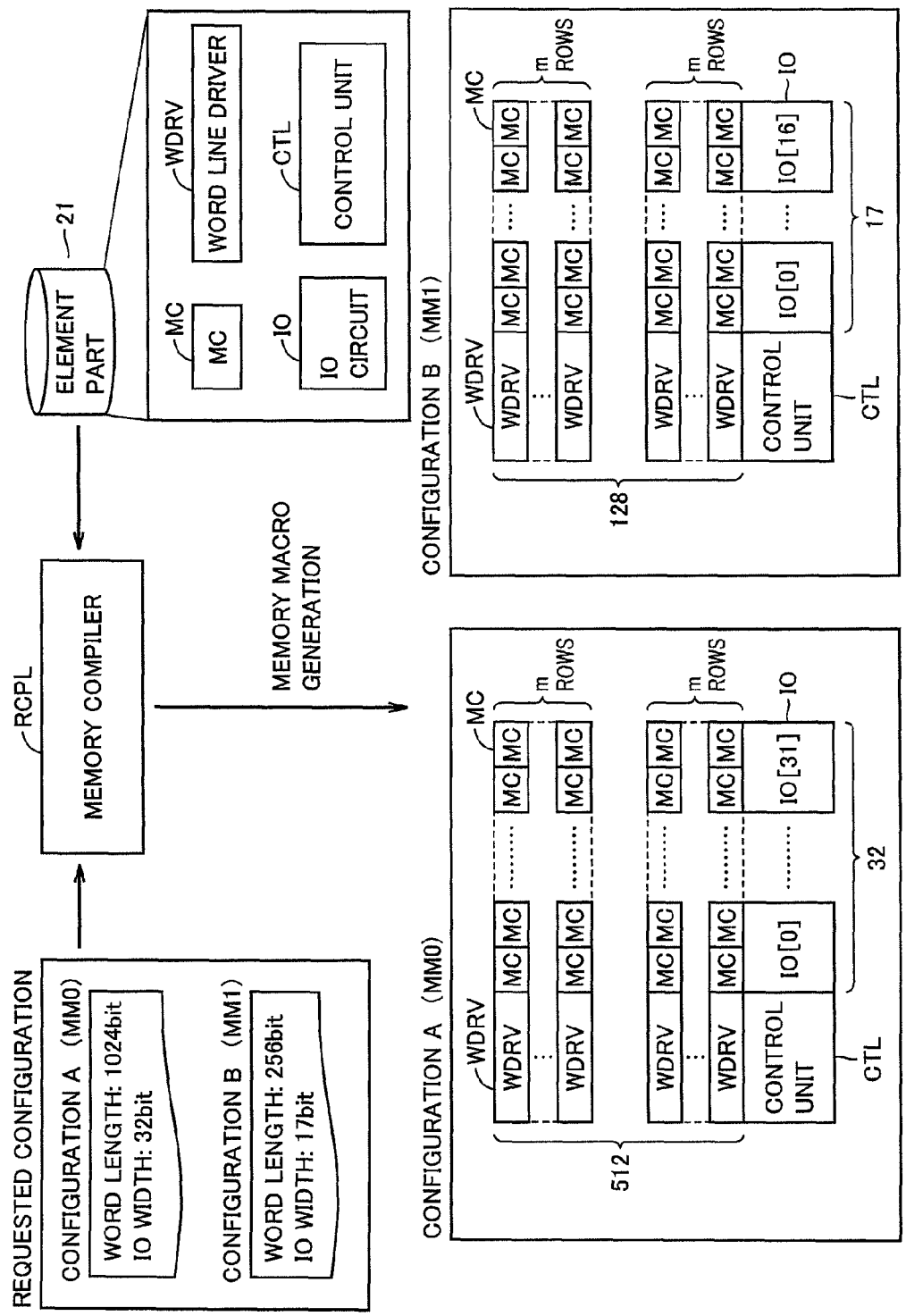
FIG. 2 is a diagram illustrating a method of generating a memory macro by a memory compiler.

Referring to FIG. 2, the method of generating a memory macro by a memory compiler will then be described.

Based on the requested configuration of the memory macro required in the central processing unit or the specific functional circuit block, a memory compiler RCPL selects various types of circuit blocks forming a memory macro from an element part storage unit 21, and generates a memory macro having the requested configuration. For example, the method of generating memory macro MM0 of specific functional circuit block MEMU and memory macro MM1 of specific functional circuit block BBU in FIG. 1 is as described below.

A configuration A shows a requested configuration of memory macro MM0 having a word length of 1024 bits and an IO width of 32 bits. A configuration B shows a requested configuration of memory macro MM1 having a word length of 256 bits and an IO width of 17 bits. Element part storage unit 21 stores each circuit block such as a memory cell MC, a word line driver WDRV, an IO circuit IO, and a control unit CTL required for generating a memory macro.

Based on each requested configuration of configuration A and configuration B, memory compiler RCPL combines the required number of circuit blocks stored in element part storage unit 21, and generates memory macro MM0 and memory macro MM1. Accordingly, in memory macro MM0 and memory macro MM1, while the number of circuit blocks such as IO circuit IO and the like varies depending on the requested configuration, circuit blocks having the same function have the same configuration. In addition, when a memory macro is generated by the memory compiler in accordance with the word length and the IO width of the requested configuration, memory cells MC arranged in the column direction (the bit line direction) are configured such that memory cells MC equal to an integral multiple (1, 2, 3, . . . ) of m rows set at a prescribed value are arranged in the column direction (bit line direction) so as to implement the requested word length.

In memory macro MM0 of configuration A, 32 IO circuits IO are arranged in the row direction and have an IO width of 32 bits. Then, 512 rows of memory cells MC that are selected in each word line driver WDRV are arranged in the column direction. Thus, the word length including two columns of memory cells MC included in each IO circuit IO is 1024 bits. In memory macro MM1 of configuration B, 17 IO circuits IO are arranged in the row direction and have an IO width of 17 bits. Also, 128 rows of memory cells MC that are selected in each word line driver WDRV are arranged in the column direction. Thus, the word length including two columns of memory cells MC included in each IO circuit IO is 256 bits. In memory macro MM0 and memory macro MM1, the number of rows of memory cells MC arranged in the column direction is set at a value equal to the required integral multiple of basic unit m so as to achieve each requested word length.

Figure 3:
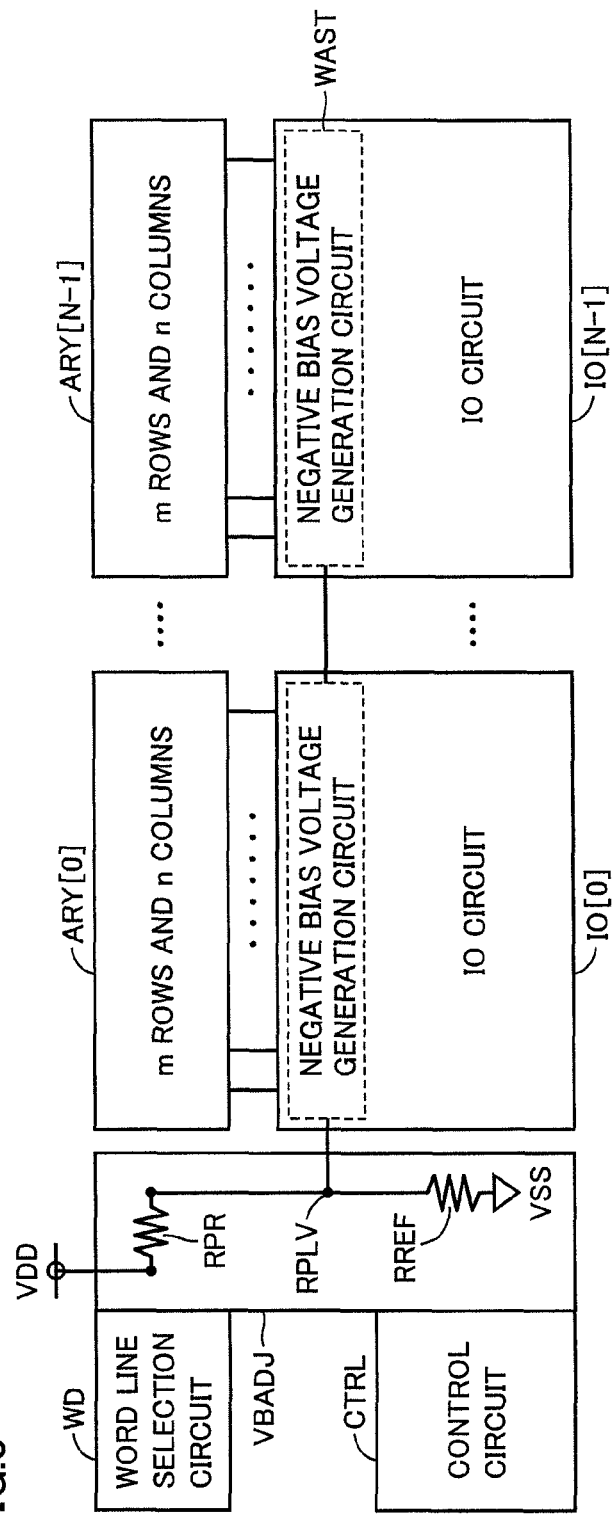
FIG. 3 is a configuration diagram of the memory macro included in the semiconductor device according to the first embodiment.

Referring to FIG. 3, the configuration of the memory macro included in semiconductor device LSI according to the first embodiment will then be described.

The memory macro shown in FIG. 3 has a configuration in which a plurality of memory cells are arranged in the number of rows of basic unit m that is generated by the memory compiler. Each memory cell array such as a memory cell array ARY[0] to a memory cell anay ARY[N−1] (which may be hereinafter referred to as a memory cell array ARY) is formed of memory cells (not shown) arranged in m rows and n columns, and the number of memory cell arrays corresponds to N bits of an IO width. IO circuits such as an IO circuit IO[0] to an IO circuit IO[N−1] (which may be hereinafter referred to as an IO circuit IO) each write or read data into or from memory cell array ARY[0] to memory cell anay ARY[N−1].

A negative bias voltage generation circuit WAST included in IO circuit IO is disposed adjacent to memory cell anay ARY. A word line selection circuit WD is disposed adjacent to memory cell anay ARY[0]. Based on the address signal that is not shown, word line selection circuit WD selects one word line from m rows of word lines included in memory cell array ARY. A control circuit CTRL is disposed adjacent to IO circuit IO[0]. Control circuit CTRL controls the IO circuit, word line selection circuit WD and the like, to control the reading operation, the writing operation and the like for memory cell array ARY.

A negative bias reference voltage generation unit VBADJ is disposed between each of memory cell anay ARY[0] and IO circuit IO[0] and each of word line selection circuit WD and control circuit CTRL. Negative bias reference voltage generation unit VBADJ divides the voltage between a power supply voltage VSS (hereinafter set at 0V) and a power supply voltage VDD by a replica resistor RPR and a reference resistor RREF connected in series, and outputs the resultant value as a negative bias reference voltage RPLV to negative bias voltage generation circuit WAST.

Figure 4:
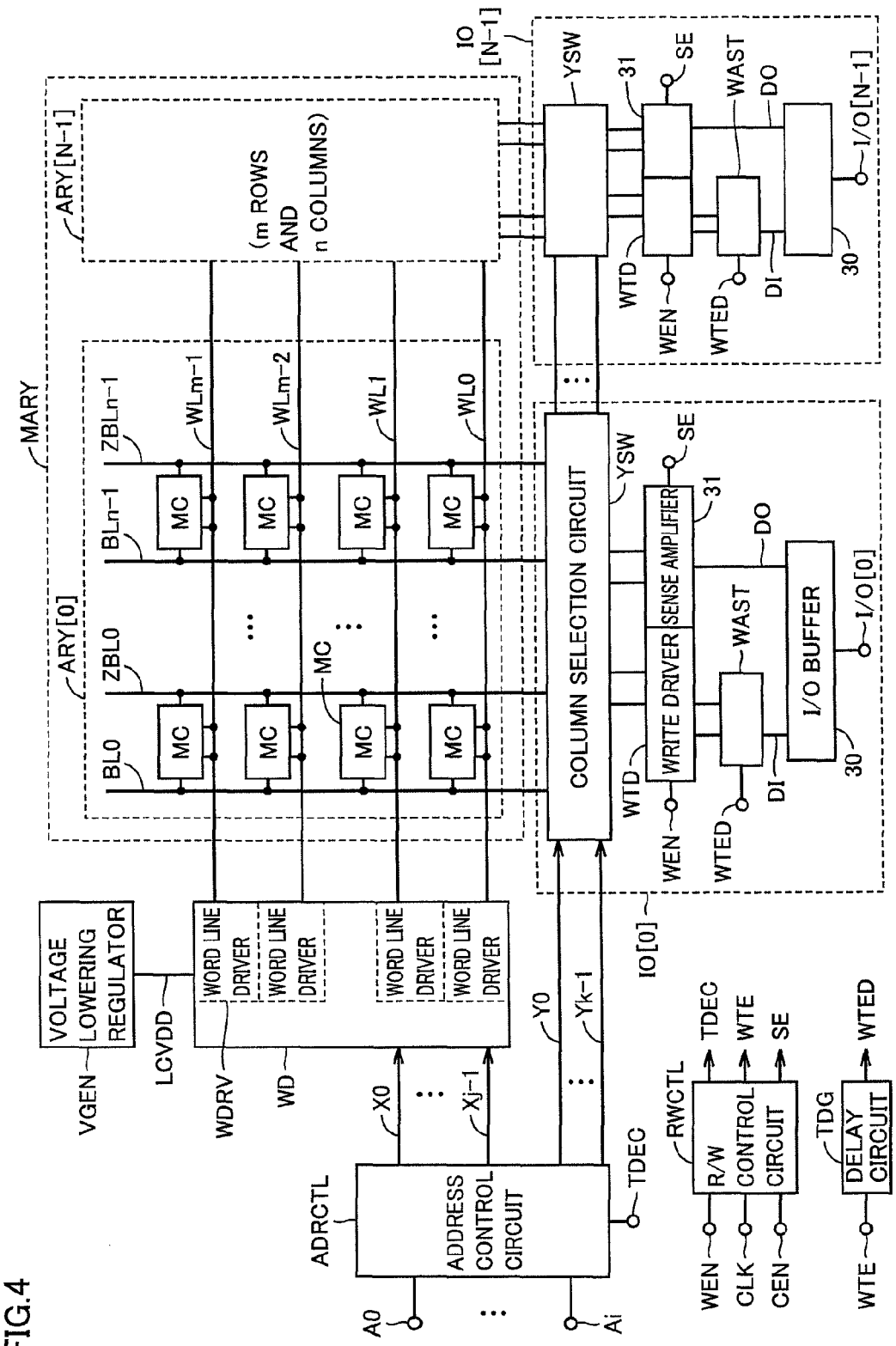
FIG. 4 is a circuit diagram of the memory macro included in the semiconductor device according to the first embodiment.

Referring to FIG. 4, the circuit diagram of the memory macro included in semiconductor device LSI according to the first embodiment will then be described.

The memory macro includes a memory cell anay MARY, a word line selection circuit WD, IO circuits IO[0] to IO[N−1], an address control circuit ADRCTL, a read/write control circuit RWCTL, and a delay circuit TDG.

Memory cell array MARY is formed of a memory cell array ARY[0] to a memory cell array ARY[N−1] corresponding to the IO width of 0 to N−1. Each memory cell array ARY has a plurality of memory cells MC arranged in an array in which n and m memory cells MC are arranged in the word line WL direction and the bit line BL/ZBL direction, respectively. In other words, each memory cell ARY has a plurality of memory cells MC in which one row of n memory cells arranged in the word line WL direction are arranged in m rows as a basic unit in the bit line direction. Hereinafter, word lines WL0, WL1 and the like may be collectively referred to as a word line WL, while bit lines BL0/ZBL0 and the like may be collectively referred to as a bit line BL/ZBL.

Word line selection circuit WD has m word line drivers WDRV selecting a word line WL0 to a word line WLm−1, respectively, and a decoder circuit (not shown) selecting one of m word line drivers WDRV. Address control circuit ADRCTL synchronizes with a control signal TDEC, and generates a signal X0 to a signal Xj−1 and a signal Y0 to a signal Yk−1 based on input address signals A0 to Ai. Word line selection circuit WD selects one word line driver WDRV based on signal X0 to signal Xj−1. A voltage lowering regulator VGEN supplies a power supply voltage LCVDD obtained by lowering power supply voltage VDD to a prescribed value to word line selection circuit WD.

IO circuit IO[0] is an IO circuit of 0 bit among N-bit IO width, and includes a column selection circuit YSW, a write driver WTD, a sense amplifier 31, a negative bias voltage generation circuit WAST, and an I/O buffer 30. Based on signals Y0 to Yk−1 output from address control circuit ADRCTL, column selection circuit YSW selects one of a bit line pair BL0/ZBL0 to a bit line pair BLn−1/ZBLn−1. Bit line pair BL/ZBL selected in column selection circuit YSW is connected to an output of write driver WTD and an input of sense amplifier 31. One of write driver WTD and sense amplifier 31 is activated by a control signal WEN and a control signal SE, respectively.

In response to control signal WTED, negative bias voltage generation circuit WAST applies a negative bias voltage to one of bit line pair BL/ZBL through write driver WTD and column selection circuit YSW. I/O buffer 30, which is an input/output buffer, functions as an input buffer that outputs write data DI applied to an I/O terminal IO[0] to write driver WTD, and also as an output buffer that outputs an output DO of sense amplifier 31 through I/O terminal IO[0]. The configurations of other IO circuits IO[N−1] and the like are the same as that of IO circuit IO[0].

A read/write control circuit RWCTL outputs control signal TDEC, control signal WTE and control signal SE based on control signal WEN, a clock CLK and a control signal CEN. Delay circuit TDG outputs a control signal WTED that is obtained by delaying input control signal WTE for a prescribed time period.

Figure 5:
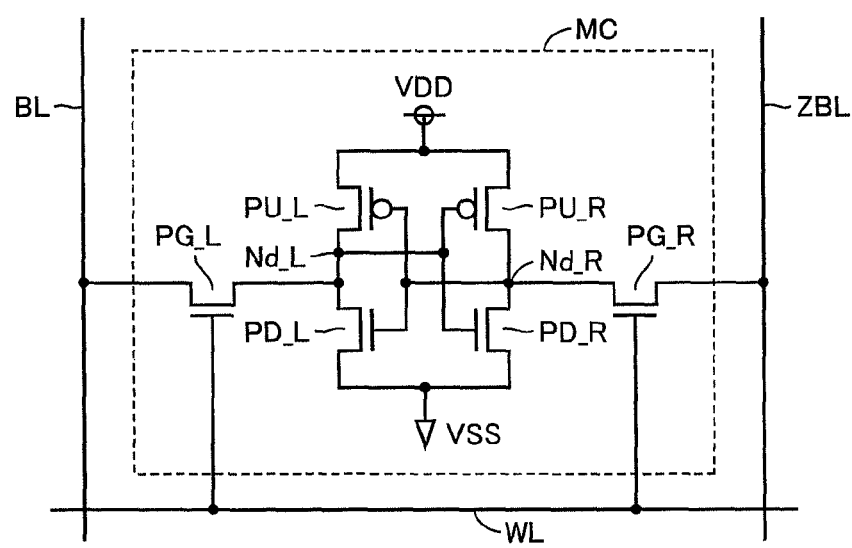
FIG. 5 is a configuration diagram of the memory cell included in the semiconductor device according to the first embodiment.

Referring to FIG. 5, the configuration of memory cell MC included in semiconductor device LSI according to the first embodiment will then be described.

Memory cell MC includes a p type transistor PU_L having a source applied with supply voltage VDD, and a drain and a gate connected to a memory node Nd_L and a memory node Nd_R, respectively; and an n type transistor PD_L having a source applied with power supply voltage VSS, and a drain and a gate connected to memory node Nd_L and memory node Nd_R, respectively. Furthermore, memory cell MC includes a p type transistor PU_R having a source applied with power supply voltage VDD, and a drain and a gate connected to memory node Nd_R and memory node Nd_L, respectively; and an n type transistor PD_R having a source applied with power supply voltage VSS, and a drain and a gate connected to memory node Nd_R and memory node Nd_L, respectively. Furthermore, memory cell MC includes an n type transistor PG_L having a source and a drain, one of which is connected to memory node Nd_L and the other of which is connected to bit line BL, and a gate connected to word line WL; and an n type transistor PG_R having a source and a drain, one of which is connected to memory node Nd_R and the other of which is connected to bit line ZBL, and a gate connected to word line WL.

Figure 6:
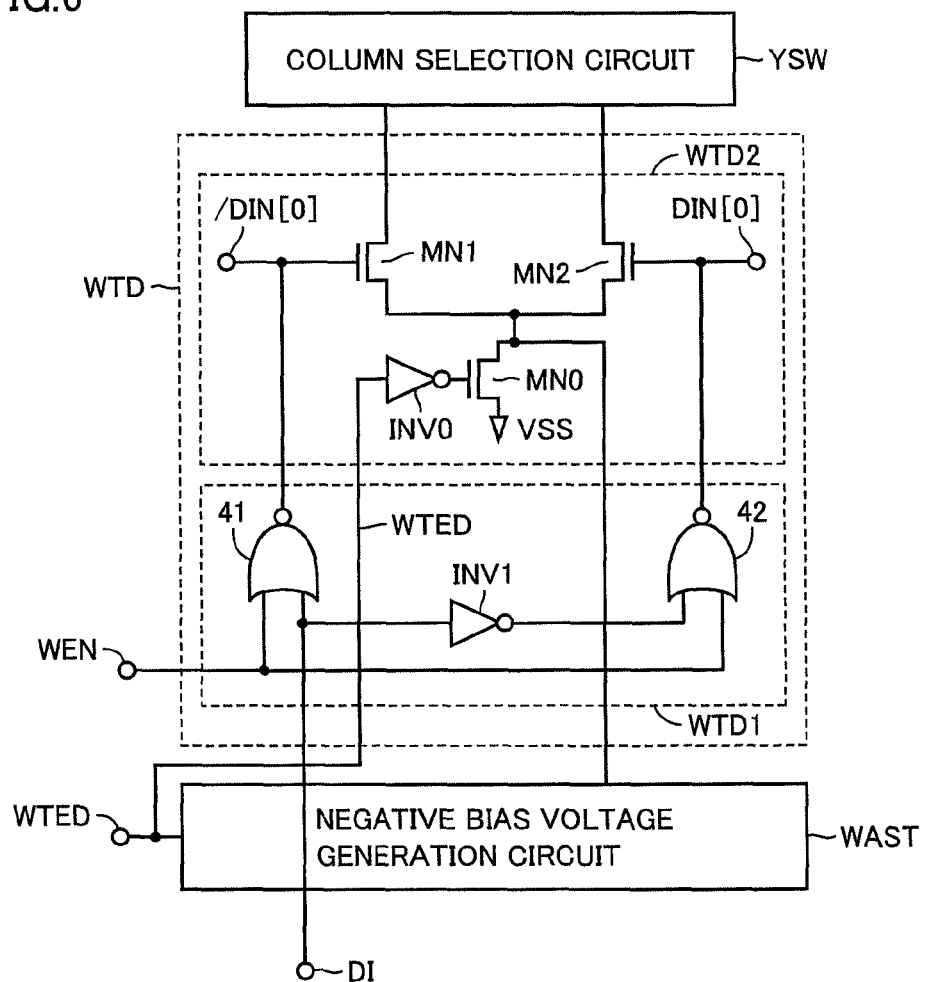
FIG. 6 is a circuit diagram of a write driver included in the semiconductor device according to the first embodiment.

Referring to FIG. 6, a circuit diagram of write driver WTD included in semiconductor device LSI according to the first embodiment will then be described.

Write driver WTD includes a write driver fore stage unit WTD1 and a write driver rear stage unit WTD2. Write driver fore stage unit WTD1 includes a NOR circuit 41 and a NOR circuit 42 each having two terminals, one of which is applied with control signal WEN as an input signal. The other terminal of NOR circuit 41 is applied with write data DI as an input signal while the other terminal of NOR circuit 42 is applied with a signal as an input signal that has a logic level inverted from that of write data DI by an inverter INV1. In other words, when control signal WEN is set at a low level, NOR circuit 41 and NOR circuit 42 output a signal at the logic level in opposite phase to write data DI and a signal at the logic level in the same phase as write data DI, respectively. When control signal WEN is set at a high level, NOR circuit 41 and NOR circuit 42 each output a signal at a low level.

Write driver rear stage unit WTD2 includes an n type transistor MN1 having a gate to which an output of NOR circuit 41 is applied and an n type transistor MN2 having a gate to which an output of NOR circuit 42 is applied. N type transistor MN1 and n type transistor MN2 each have a source that is connected to a drain of an n type transistor MN0 having a source applied with power supply voltage VSS. N type transistor MN1 and n type transistor MN2 each have a drain that is connected to column selection circuit YSW. An input terminal/DIN[0] connected to the gate of n type transistor MN1 is applied with a signal having a logic level inverted from that of write data DI. An input terminal DIN[0] connected to the gate of n type transistor MN2 is applied with a signal on the same logic level as that of write data DI. N type transistor MN0 has a gate that is applied with a signal having a logic level inverted from that of control signal WTED by an inverter INV0. N type transistor MN0 has a drain that is connected further to an output of negative bias voltage generation circuit WAST.

Figure 7:
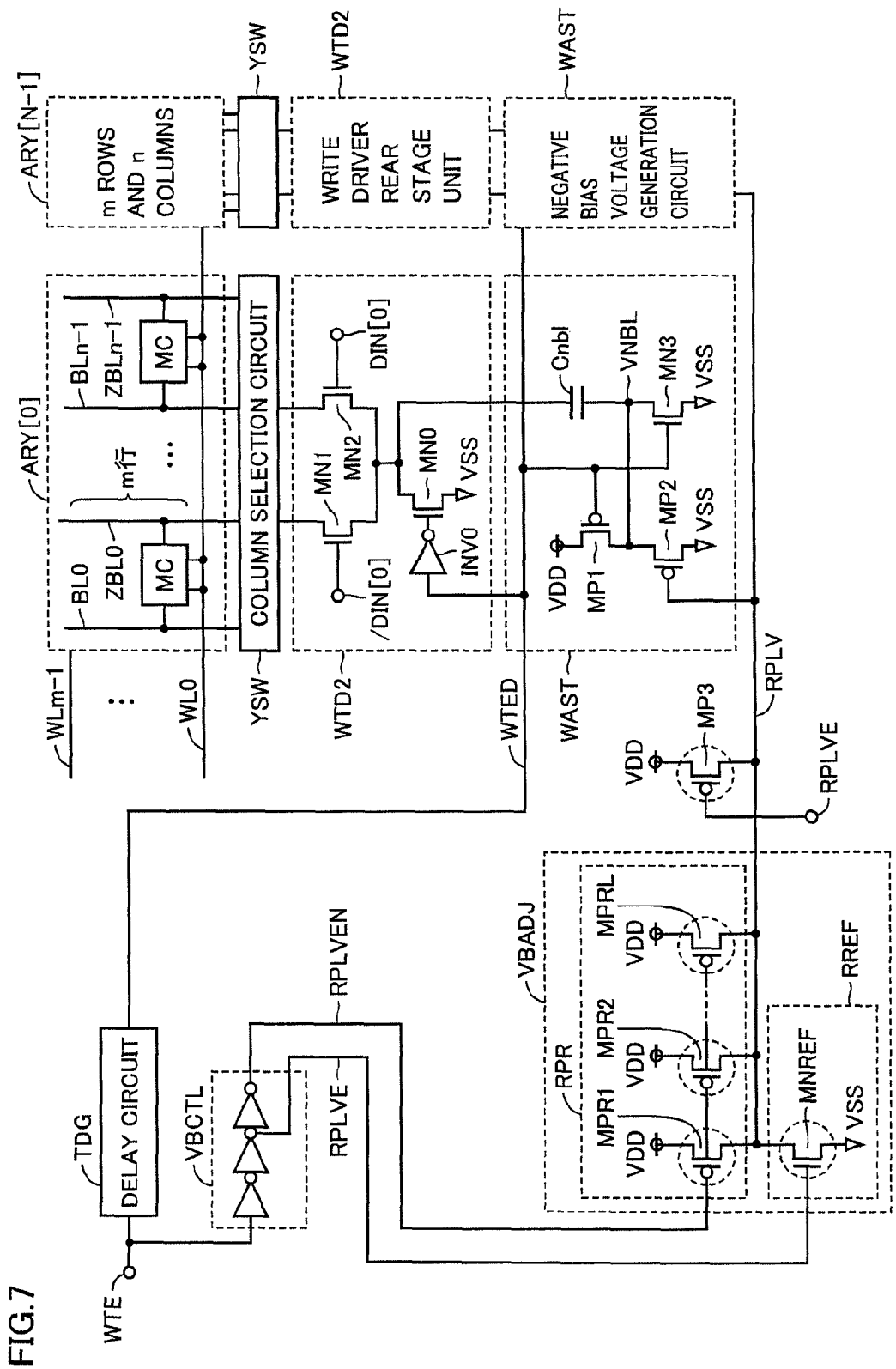
FIG. 7 is a circuit diagram of each of a negative bias voltage generation circuit and a negative bias reference voltage generation unit included in the semiconductor device according to the first embodiment.

Referring to FIG. 7, the circuit diagram of negative bias voltage generation circuit WAST and negative bias reference voltage generation unit VBADJ included in semiconductor device LSI according to the first embodiment will then be described.

Negative bias voltage generation circuit WAST has a p type transistor MP1, a p type transistor MP2, an n type transistor MN3, and a capacitance element Cnbl. P type transistor MP1 has a source applied with power supply voltage VDD, a drain connected to an electric charge amount adjustment node VNBL, and a gate applied with control signal WTED. P type transistor MP2 has a source connected to electric charge amount adjustment node VNBL, a drain applied with power supply voltage VSS, and a gate applied with a negative bias reference voltage RPLV (which may be also hereinafter referred to as a negative bias reference interconnection) output from negative bias reference voltage generation unit VBADJ. N type transistor MN3 has a drain connected to electric charge amount adjustment node VNBL, a source applied with power supply voltage VSS, and a gate applied with control signal WTED. Capacitance element Cnbl has one end connected to electric charge amount adjustment node VNBL and the other end connected to the drain of n type transistor MN included in write driver rear stage unit WTD2.

Capacitance element Cnbl can be implemented in various structures. When semiconductor device LSI is manufactured in a DRAM (Dynamic Random Access Memory) integration process, capacitance element Cnbl can be formed in the step of forming a cell capacitance of a DRAM. Furthermore, it is also conceivable to form capacitance element Cnbl in a MIM (Metal-Insulator-Metal) structure or also with an MOS capacitance of a Fin-FET structure.

The configuration of write driver rear stage unit WTD2 is as shown in FIG. 6. Among a pair of bit line pair BL/ZBL (for example, bit line pair BL0/ZBL0) selected in column selection circuit YSW, bit line BL0 is connected to the drain of n type transistor MN1 while bit line ZBL0 is connected to the drain of n type transistor MN2. When data is written in memory cell MC selected by word line WL0 and bit line pair BL0/ZBL0, word line WL0 is set at a high level, control signal WEN (see FIG. 6) is set at a low level (power supply voltage VSS), and control signal WTED is set at a low level. Consequently, write driver fore stage unit WTD1 shown in FIG. 6 applies the signal having a logic level inverted from that of write data DI to input terminal/DIN[0] and also applies the signal having the same logic level as that of write data DI to input terminal DIN[0].

Depending on the logic level of write data DI, one of n type transistor MN1 and n type transistor MN2 (for example, n type transistor MN2) is brought into a conduction state, and the voltage on bit line ZBL0 connected to n type transistor MN2 is lowered from power supply voltage VDD to power supply voltage VSS. When this voltage on bit line ZBL0 is lowered to power supply voltage VSS, the output of the inverter formed of p type transistor PU_L and n type transistor PD_L in memory cell MC starts transitioning to a high level (power supply voltage VDD) while the output of the inverter formed of p type transistor PU_R and n type transistor PD_R starts transitioning to a low level (power supply voltage VSS) (see FIG. 5).

Hereinafter described will be a configuration of each of negative bias reference voltage generation unit VBADJ and negative bias voltage generation circuit WAST for ensuring the writing operation margin of this memory cell MC.

Negative bias reference voltage generation unit VBADJ has a replica resistor RPR and a reference resistor RREF. Replica resistor RPR is formed of a total of L p type transistors including a p type transistor MPR1 to a p type transistor MPRL connected in parallel. Each of these p type transistors has a source applied with power supply voltage VDD and a drain connected to a negative bias reference interconnection RPLV. P type transistors MPR1 to MPRL each have a gate applied with a control signal RPLVEN. Reference resistor RREF is formed of an n type transistor MNREF having a drain connected to negative bias reference interconnection RPLV, a source applied with power supply voltage VSS, and a gate applied with control signal RPLVE.

When p type transistors MPR1 to MPRL each are brought into a conduction state by control signal RPLVEN and n type transistor MNREF is brought into a conduction state by control signal RPLVE, negative bias reference voltage RPLV is set at a value represented by equation 1 that is obtained by dividing the voltage between power supply voltage VSS and power supply voltage VDD by the on-resistance value of p type transistors MPR1 to MPRL connected in parallel and the on-resistance value of n type transistor MNREF.

$$RPLV = VDD * Rref/(Rref + Rpr) \qquad \text{Equation 1}$$

In equation 1, VDD is a value of power supply voltage VDD, RPLV is a negative bias reference voltage value, Rref is an on-resistance value of reference resistor RREF, Rpr is an on-resistance value of replica resistor RPR, a symbol "/" is a division sign, and a symbol "*" is a multiplication sign.

When replica resistor RPR and reference resistor RREF each are in a non-conduction state, the voltage on negative bias reference interconnection RPLV is raised to power supply voltage VDD by a p type transistor MP3 controlled by control signal RPLVE to be brought into a conduction state.

In negative bias voltage generation circuit WAST, when control signal WTED is set at a low level to bring p type transistor MP1 into a conduction state and bring n type transistor MN3 into a non-conduction state, the voltage on electric charge amount adjustment node VNBL is determined by the on-resistance value of p type transistor MP1 and the on-resistance value of p type transistor MP2. When negative bias reference voltage RPLV is raised, the voltage on electric charge amount adjustment node VNBL rises. When negative bias reference voltage RPLV is lowered, the voltage on electric charge amount adjustment node VNBL falls. During the time period for which control signal WTED is set at a low level, the voltage on electric charge amount adjustment node VNBL is applied to one end of capacitance element Cnbl, and power supply voltage VSS output from n type transistor MN0 of write driver rear stage unit WTD2 is applied to the other end of capacitance element Cnbl. Therefore, the amount of electric charge accumulated in capacitance element Cnbl is determined by the resistance ratio between replica resistor RPR and reference resistor RREF.

Figure 8:
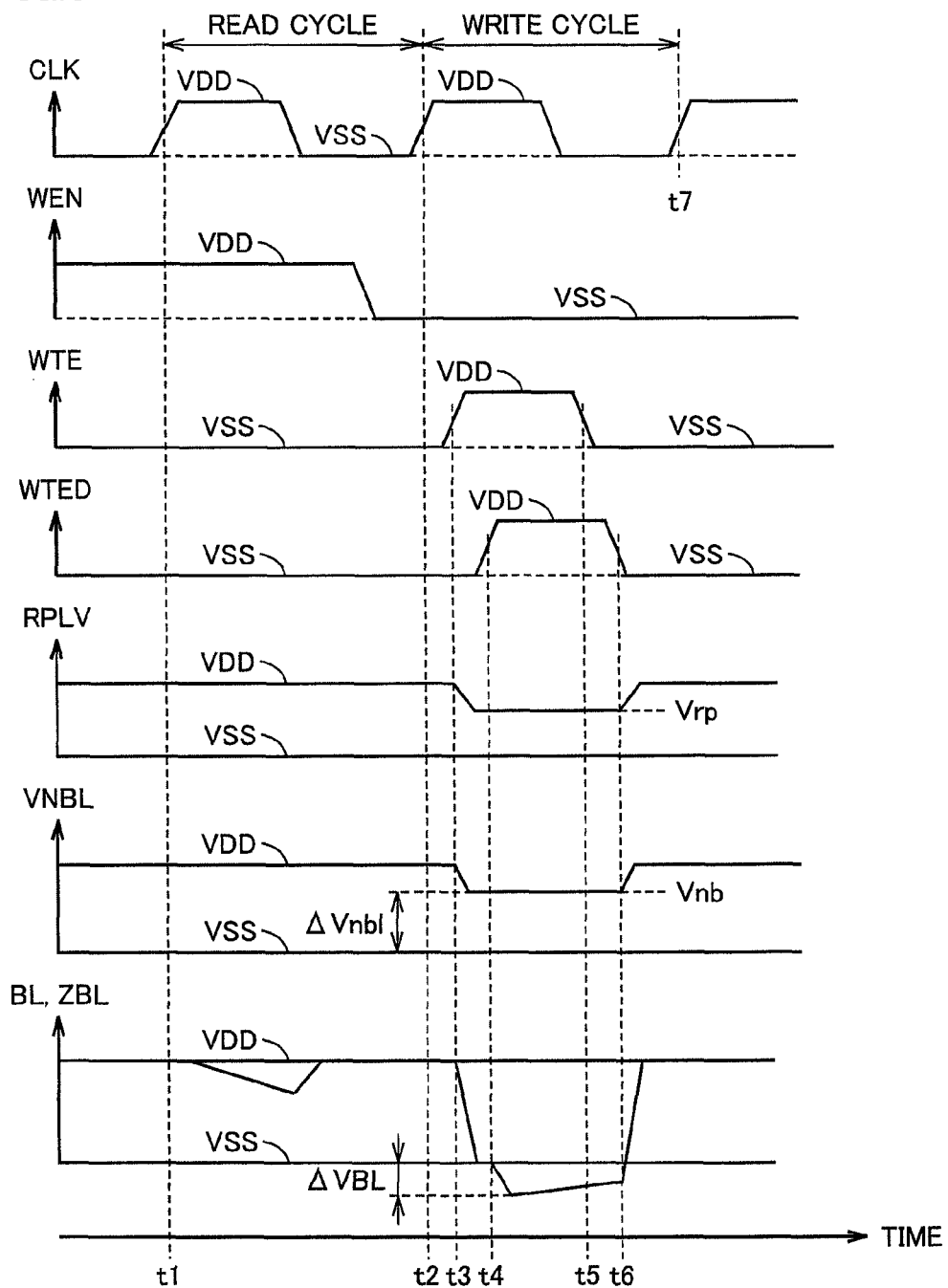
FIG. 8 is a timing diagram illustrating operations of the negative bias voltage generation circuit and the negative bias reference voltage generation unit included in the semiconductor device according to the first embodiment.

Referring to FIG. 8, the operations of negative bias voltage generation circuit WAST and negative bias reference voltage generation unit VBADJ included in semiconductor device LSI according to the first embodiment will then be described.

FIG. 8 is a timing diagram schematically showing a change in each signal. A symbol "VDD" means a power supply voltage VDD, and a symbol "VSS" means a power supply voltage VSS. The horizontal axis of each signal is a common time axis indicated as time. The operation of each circuit in FIG. 7 will be hereinafter described with reference to FIG. 8.

One cycle of clock CLK from time t1 to time t2 is a read cycle. Control signal WEN is set at a high level and the writing operation by write driver WTD is not performed (see FIG. 6). Control signal WTE is set at a low level, and the voltage on negative bias reference interconnection RPLV is raised to power supply voltage VDD by p type transistor MP3.

Control signal WTED is also set at a low level, and the voltage on electric charge amount adjustment node VNBL is raised to power supply voltage VDD by p type transistor MP1. After a lapse of a prescribed time period from time t1, based on the data held in selected memory cell MC, the voltage on one of bit lines BL/ZBL falls from power supply voltage VDD to a prescribed voltage value, and then, bit line pair BL/ZBL is pre-charged to power supply voltage VDD.

Before time t2, control signal WEN is changed from a high level to a low level, and write driver WTD is activated.

Clock CLK changes from a low level to a high level at time t2. One cycle of clock CLK till time t7 is a write cycle.

When control signal WTE changes from a low level to a high level at time t3, negative bias reference voltage generation unit VBADJ is activated, and the voltage on negative bias reference interconnection RPLV is changed from power supply voltage VDD to a voltage Vrp. This voltage Vrp is determined by the ratio between the value of replica resistor RPR and the value of reference resistor RREF. In accordance with a change in negative bias reference voltage RPLV, the voltage on electric charge amount adjustment node VNBL falls from power supply voltage VDD to voltage Vnb. Thus, the voltage between power supply voltage VSS and electric charge amount adjustment node VNBL is a bias voltage $\Delta$Vnbl. On the other hand, in bit line pair BL0/ZBL0, the voltage on bit line /ZBL0 is abruptly decreased to power supply voltage VSS after time t3 by n type transistor MN2 of write driver rear stage unit WTD2.

When control signal WTED changes from a low level to a high level at time t4, n type transistor MN0 in write driver rear stage unit WTD2 is brought into a non-conduction state while n type transistor MN3 in negative bias voltage generation circuit WAST is brought into a conduction state. As a result, the voltage on one end of capacitance element Cnbl connected to the drain of n type transistor MN3 falls from voltage Vnb to power supply voltage VSS, that is, falls by bias voltage $\Delta$Vnbl. Consequently, the voltage on the other end of capacitance element Cnbl that is applied with power supply voltage VSS by n type transistor MN0 of write driver rear stage unit WTD2 before time t4 falls by bias voltage $\Delta$Vnbl with respect to power supply voltage VSS after time t4.

This bias voltage $\Delta$Vnbl generated at one end (electric charge amount adjustment node VNBL) of capacitance element Cnbl causes a further decrease of the voltage on bit line ZBL0 by negative bias voltage $\Delta$VBL, in which case this voltage on bit line ZBL0 has been decreased to power supply voltage VSS by n type transistor MN2 of write driver rear stage unit WTD2 that is in a conduction state. As a result, the voltage on bit line ZBL0 falls from power supply voltage VSS (0V) by negative bias voltage $\Delta$VBL in the negative voltage direction. This value of negative bias voltage $\Delta$VBL decreases with an increase in the parasitic capacitance on bit line BL/ZBL, and increases with an increase in bias voltage $\Delta$Vnbl, that is, an increase in the amount of accumulated electric charge in capacitance element Cnbl. The relation of the following equation 2 lies between negative bias voltage $\Delta$VBL and bias voltage $\Delta$Vnbl. In addition, since n type transistor MN1 of write driver rear stage unit WTD2 is in a non-conduction state, negative bias voltage $\Delta$VBL is not applied to bit line BL0, which is maintained at power supply voltage VDD.

$$\Delta VBL = Cnbl/(Cnbl+Cbl) * \Delta Vnbl \qquad \text{Equation 2}$$

In equation 2, Cbl shows a load capacitance on each of bit line BL and bit line ZBL.

In order to set negative bias voltage $\Delta$VBL at a desired value that is to be applied to bit line BL or bit line ZBL in memory cell array ARY having memory cells arranged in the number of rows of basic unit m shown in FIG. 3, the amount of electric charge that is to be supplied to load capacitance Cbl on bit line BL/ZBL needs to be accumulated in capacitance element Cnbl. Equation 2 shows a value of bias voltage $\Delta$Vnbl that is to be applied to capacitance element Cnbl for that purpose. As shown in equation 1, this bias voltage $\Delta$Vnbl is determined by the on-resistance of reference resistor RREF and the on-resistance of replica resistor RPR included in negative bias reference voltage generation unit VBADJ.

When control signal WTE changes from a high level to a low level at time t5, control signal WTED changes from a high level to a low level at time t6 after a lapse of a prescribed time period. In accordance with this change, the voltage on each of negative bias reference interconnection RPLV, electric charge amount adjustment node VNBL and bit line ZBL is raised to power supply voltage VDD.

When the voltage on bit line ZBL0 falls from power supply voltage VSS in the negative voltage direction and further falls to negative bias voltage $\Delta$VBL, in memory cell MC shown in FIG. 5, the voltage between the source (connected to bit line ZBL0) and the gate (connected to word line WL) of n type transistor PG_R is further increased, thereby increasing the driving capability of n type transistor PG_R. Consequently, the voltage on memory node Nd_R abruptly falls due to this increased driving capability of n type transistor PG_R, and then, writing in memory cell MC is completed.

Figure 9:
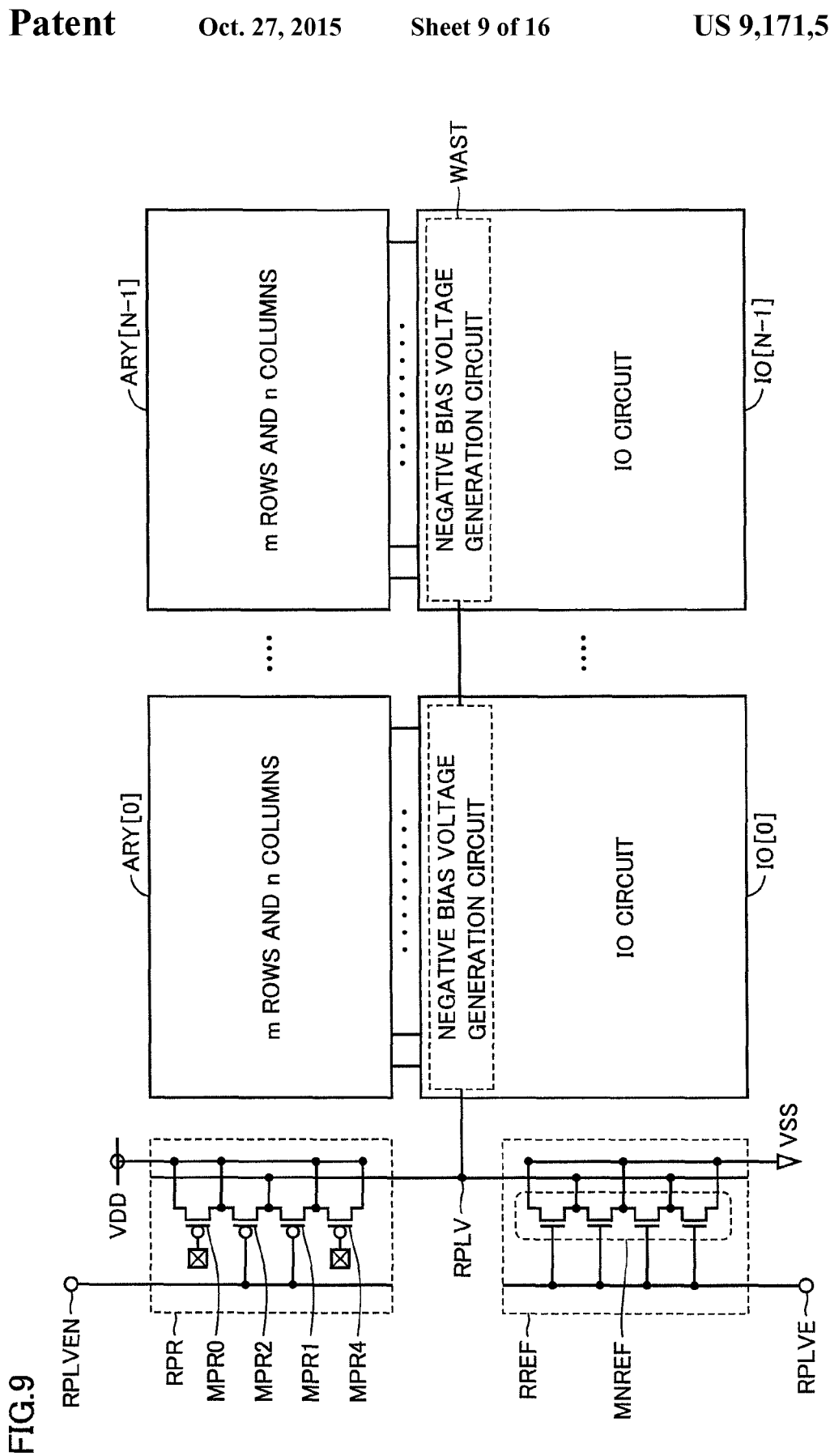
FIG. 9 is an arrangement diagram of the negative bias reference voltage generation unit included in the semiconductor device according to the first embodiment.

Referring to FIG. 9, the arrangement of negative bias reference voltage generation unit VBADJ included in semiconductor device LSI according to the first embodiment will then be described.

As shown in FIG. 3, in negative bias reference voltage generation unit VBADJ, reference resistor RREF is disposed adjacent to IO circuit IO[0] while replica resistor RPR is disposed adjacent to memory cell array ARY[0]. FIG. 9 shows an arrangement example of an n type transistor MNREF forming reference resistor RREF and p type transistors MPR0 to MPR4 forming replica resistor RPR.

Although n type transistor MNREF forming reference resistor RREF is represented by one n type transistor in the circuit diagram, it is desirable to have a configuration in which a plurality of n type transistors are connected in parallel in terms of layout. By way of example, as shown in FIG. 9, n type transistor MNREF has a configuration in which four n type transistors are connected in parallel between the power supply interconnection for supplying power supply voltage VSS and negative bias reference interconnection RPLV, and control signal RPLVE is applied to the gate of each n type transistor. In order to implement n type transistor MNREF that can suppress the influence of local variations and has a desired on-resistance, n type transistor MNREF preferably has a configuration in which n type transistors each having a gate length longer than that defined by the technology node are connected in parallel. For example, it is preferable to set this gate length to be longer than the gate length of each transistor forming a memory cell.

By way of example, p type transistors MPR1 to MPR4 forming replica resistor RPR has a configuration in which, for m rows of memory cell arrays ARY, two p type transistors MPR1 and MPR2 are connected in parallel between the power supply interconnection for supplying power supply voltage VDD and negative bias reference interconnection RPLV, and control signal RPLVEN is applied to the gate of each p type transistor. For the purpose of suppressing the influence of local variations, it is preferable that p type transistors MPR1 and MPR2 each are a p type transistor having a gate length longer than that defined by the technology node.

P type transistor MPR0 and p type transistor MPR4 included in replica resistor RPR each are a dummy transistor, and not directly involved in generation of negative bias reference voltage RPLV. These dummy transistors each have a source and a drain applied with power supply voltage VDD, and also have a gate in a floating state. These p type transistors MPR0 and MPR4 are arranged so as to prevent an edge effect from causing a change in the shape of a gate electrode of each of p type transistors MPR1 and MPR2 extending in the row direction and arranged regularly in the column direction. When it is not necessary to consider the adverse influence by the edge effect, a dummy transistor may not be arranged.

In order to suppress the influence of local variations, it is preferable that p type transistors MP1 and MP2 in negative bias voltage generation circuit WAST (see FIG. 7) each have a gate length longer than that defined by the technology node.

Figure 10:
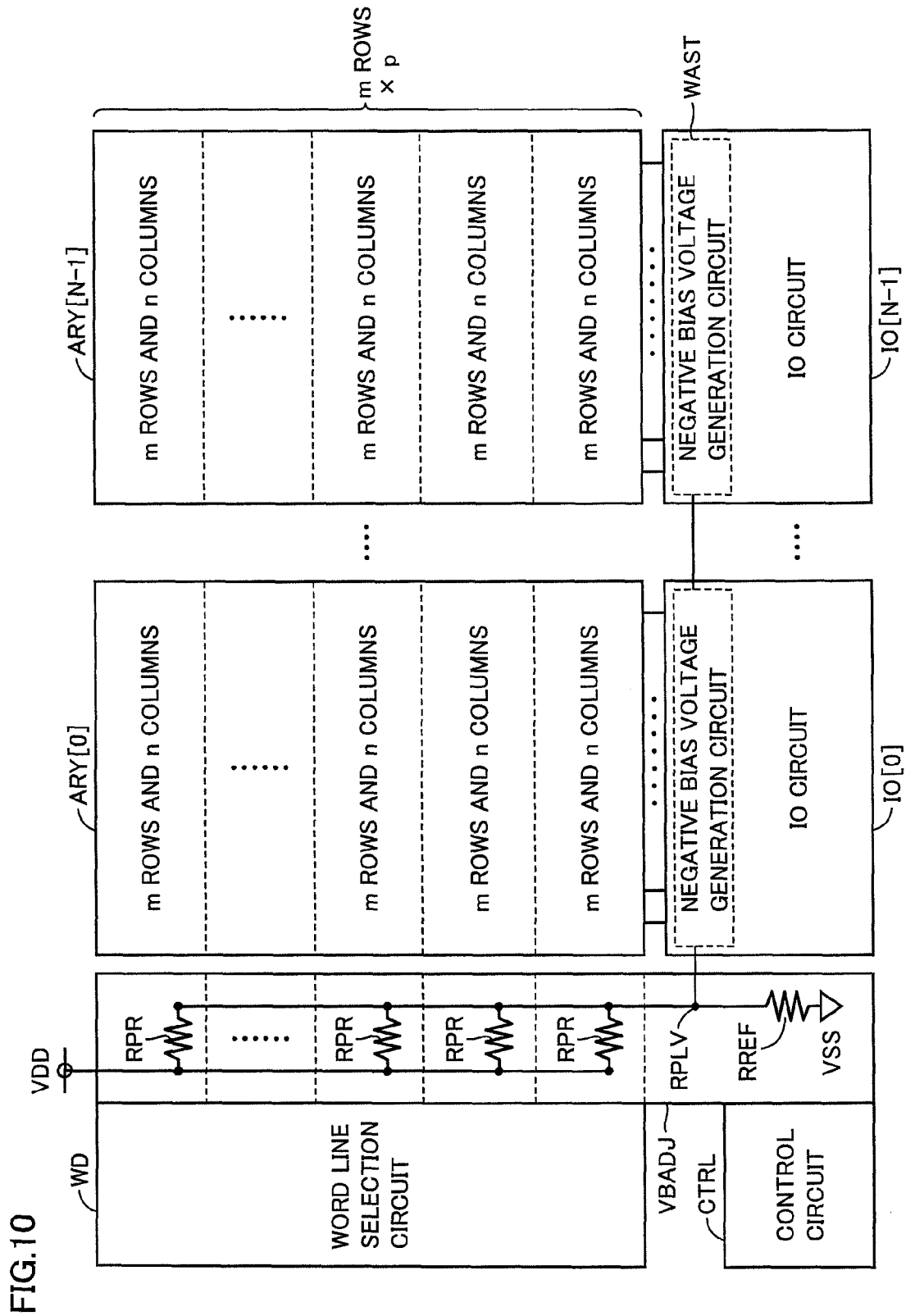
FIG. 10 is a configuration diagram of another memory macro included in the semiconductor device according to the first embodiment.

Referring to FIG. 10, the configuration of another memory macro included in semiconductor device LSI according to the first embodiment will then be described.

The memory macro shown in FIG. 10 has memory cell arrays ARY[0] to ARY[N−1] in which p (p is an integer of 2 or more) memory cell arrays each having memory cells arranged in the number of rows of basic unit m shown in FIG. 3 are arranged in the bit line direction. Adjacent to memory cell array ARY[0], replica resistor RPR is disposed for each of p memory cell arrays each having memory cells arranged in the number of rows of basic unit m. One reference resistor RREF is disposed adjacent to IO circuit IO[0]. P replica resistors RPR each have one end applied with power supply voltage VDD, and the other end connected in common to negative bias reference interconnection RPLV. Reference resistor RREF has one end applied with power supply voltage VSS, and the other end connected to negative bias reference interconnection RPLV. The voltage between power supply voltage VSS and power supply voltage VDD is divided by the resistance ratio between p replica resistors RPR connected in parallel and one reference resistor RREF, and then, output as negative bias reference voltage RPLV to negative bias voltage generation circuit WAST. In other words, in the case of the memory macro shown in FIG. 10, the combined resistors having p replica resistors RPR each serving as a unit resistor connected in parallel function as a replica resistor of negative bias reference voltage generation unit VBADJ.

As described above, when a memory macro is generated by a memory compiler in accordance with the word length and the IO width of the requested configuration, memory cells MC whose number is an integral multiple of basic unit m on the basis of m rows set at a prescribed value as a basic unit are arranged in the column direction so as to implement the requested word length. Therefore, the parasitic capacitance on each bit line in the memory macro shown in FIG. 10 is increased by approximately p times with respect to the parasitic capacitance on each bit line in the memory macro shown in FIG. 3, in accordance with an increase in number of memory cells connected to the bit line and an increase in length of the bit line.

In each memory macro generated based on a different requested configuration, the number of circuits such as memory cells MC, word line drivers WDRV, IO circuits IO, and control units CTL included in each memory macro varies depending on the requested specifications, but the circuit configuration is the same. Therefore, capacitance element Cnbl included in negative bias voltage generation circuit WAST, and replica resistor RPR and reference resistor RREF included in negative bias reference voltage generation unit VBADJ are also identical in configuration to those included in the memory macro shown in FIG. 3.

In the memory macro shown in FIG. 3, as described above, negative bias reference voltage RPLV is calculated by the following equation 1, and negative bias voltage ΔVBL is calculated by the following equation 2. This negative bias voltage ΔVBL corresponds to the lowered amount of voltage on one of bit line pair BL/ZBL from power supply voltage VSS in the negative voltage direction.

$$RPLV = VDD * Rref/(Rref + Rpr) \qquad \text{Equation 1}$$

$$\Delta VBL = Cnbl/(Cnbl + Cbl) * \Delta Vnbl \qquad \text{Equation 2}$$

In the memory macro shown in FIG. 10, p replica resistors RPR are arranged so as to be connected in parallel. Consequently, an on-resistance value Rpr of replica resistor RPR in equation 1 is decreased by 1/p as compared with the case of FIG. 3, and the value of negative bias reference voltage RPLV is increased. As negative bias reference voltage RPLV increases, the voltage on electric charge amount adjustment node VNBL also increases (FIG. 7), and then, bias voltage ΔVnbl, that is, the amount of accumulated electric charge in capacitance element Cnbl is increased (FIG. 8). The increase in bias voltage ΔVnbl counteracts the decrease in negative bias voltage ΔVBL caused by an approximately p-fold increase in load capacitance Cbl on the bit line in equation 2. Consequently, negative bias voltage ΔVBL applied to the bit line in the memory macro shown in FIG. 10 is maintained at the same value as that of negative bias voltage ΔVBL in the memory macro in FIG. 3 that is calculated by equation 2.

According to negative bias voltage generation circuit WAST and negative bias reference voltage generation unit VBADJ included in semiconductor device LSI according to the first embodiment, when negative bias voltage generation circuit WAST and negative bias reference voltage generation unit VBADJ are set so as to generate a desired negative bias voltage ΔVBL in the memory cell may having memory cells arranged in the number of rows of basic unit m, it becomes possible to generate a desired negative bias voltage ΔVBL also in a memory cell array in which a plurality of memory cell arrays each having memory cells arranged in the number of rows of basic unit m are arranged in the bit line direction.

When a plurality of memory cell arrays each having memory cells arranged in the number of rows of basic unit m are arranged in the bit line direction, replica resistors RPR included in negative bias reference voltage generation unit VBADJ are connected in parallel, and the voltage on electric charge amount adjustment node VNBL in negative bias voltage generation circuit WAST is controlled so as to be maintained at desired negative bias voltage ΔVBL. Consequently, even if semiconductor device LSI is equipped with a plurality of memory macros that are different in the requested configuration generated by the memory compiler, the value of the negative voltage that is to be applied to the bit line in each memory macro is maintained at the same value in each memory macro.

Figure 11:
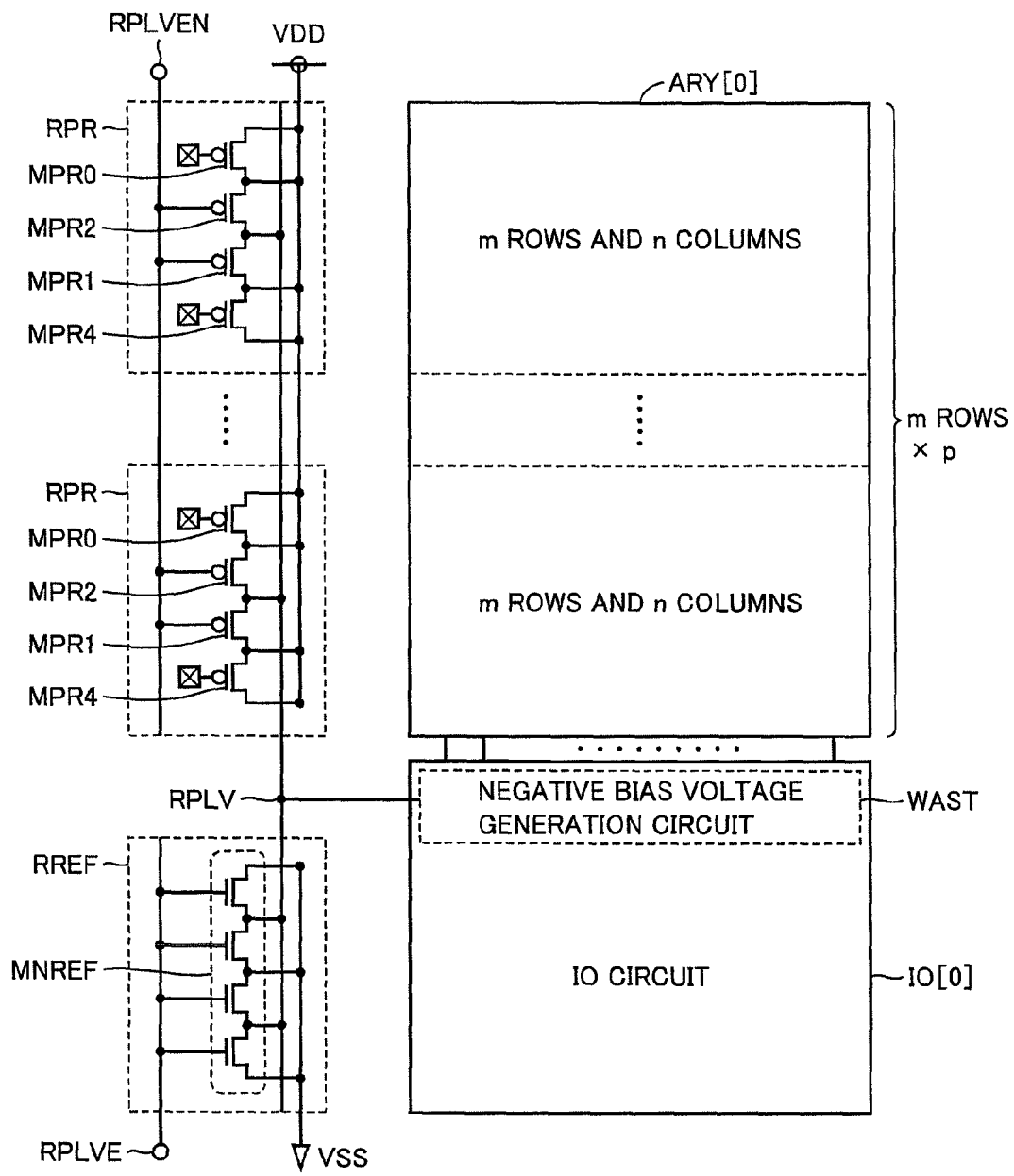
FIG. 11 is an arrangement diagram of the negative bias reference voltage generation unit in another memory macro included in the semiconductor device according to the first embodiment.

Referring to FIG. 11, the arrangement of negative bias reference voltage generation unit VBADJ in another memory macro included in semiconductor device LSI according to the first embodiment will then be described.

FIG. 11 shows an arrangement example of p replica resistors RPR (unit resistor) and one reference resistor RREF included in the memory macro shown in FIG. 10. This arrangement example is different from that shown in FIG. 9 in that replica resistor RPR is arranged for each of p memory cell arrays each having memory cells arranged in the number of rows of basic unit m. P replica resistors RPR each have a configuration in which two p type transistors MPR1 and MPR2 are connected in parallel between the power supply interconnection for supplying power supply voltage VDD and negative bias reference interconnection RPLV, and control signal RPLVEN is applied to the gate of each of these p type transistors. P type transistor MPR0 and p type transistor MPR4 included in replica resistor RPR each are a dummy transistor, and may not be provided in the case where an adverse influence of the edge effect does not need to be considered.

P replica resistors RPR have the same shape. When the memory cell arrays each having memory cells arranged in the number of rows of basic unit m are arranged in the bit line direction, replica resistors RPR are located so as to be connected in parallel. Reference resistor RREF is formed of an n type transistor NMREF in which four n type transistors are connected in parallel between the power supply interconnection for supplying power supply voltage VSS and negative bias reference interconnection RPLV, and these n type transistors each have a gate applied with control signal RPLVE.

Figure 12:
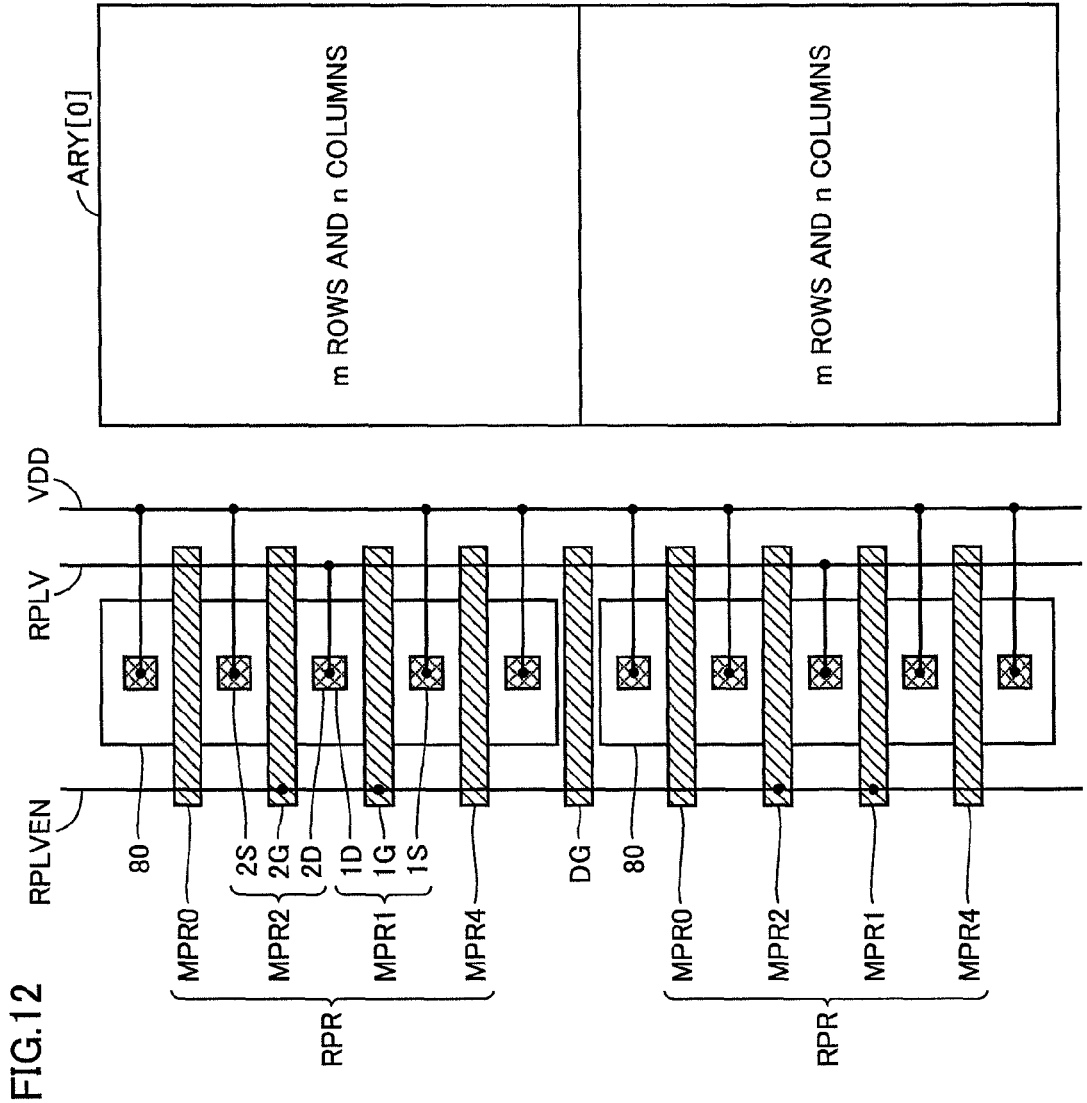
FIG. 12 is a layout diagram of a replica resistor in another memory macro included in the semiconductor device according to the first embodiment.

Referring to FIG. 12, the layout diagram of replica resistor RPR in another memory macro included in semiconductor device LSI according to the first embodiment will then be described.

FIG. 12 is a layout diagram of replica resistor RPR shown in FIG. 11. Replica resistor RPR is formed of p type transistor MPR1, p type transistor MPR2, p type transistor MPR0, and p type transistor MPR4. By way of example, FIG. 12 shows two memory cell arrays ARY each having memory cells arranged in the number of rows of basic unit m, and two replica resistors RPR. Each p type transistor forming one of two replica resistors RPR is formed in an element formation region 80. P type transistor MPR1 has a gate electrode 1G that is disposed so as to extend across element formation region 80 in the row direction. A source contact 1S and a drain contact 1D are formed to be located on both sides, respectively, across gate electrode 1G, and connected to a power supply interconnection for supplying power supply voltage VDD and negative bias reference interconnection RPLV, respectively. Control signal RPLVEN is applied to gate electrode 1G.

P type transistor MPR2 has a gate electrode 2G that is disposed so as to extend across element formation region 80 in the row direction. A source contact 2S and a drain contact 2D are formed to be located on both sides, respectively, across gate electrode 2G. Source contact 2S is connected to the power supply interconnection for supplying power supply voltage VDD. Drain contact 1D also serves as drain contact 2D, which means drain contact 1D and drain contact 2D are a single drain contact. Drain contact 2D is connected to negative bias reference interconnection RPLV. Control signal RPLVEN is applied to gate electrode 2G.

The gate electrodes of p type transistors MPR0 and MPR4 each as a dummy transistor are arranged similarly to those of p type transistors MPR1 and MPR2. Power supply voltage VDD is applied to a contact provided so as to be located across gate electrode MPR0 from source contact 2S. Power supply voltage VDD is applied to a contact disposed so as to be located across gate electrode MPR4 from source contact 1S.

The layout diagram of the other replica resistor RPR of two replica resistors RPR is the same as that of one replica resistor RPR described above, and therefore, description thereof will not be given. A dummy gate electrode DG is disposed between two element formation regions 80 each forming a replica resistor. This dummy gate electrode DG is disposed between adjacent gate electrode MPR4 and gate electrode MPR0 each serving as a dummy transistor. Dummy gate electrode DG, and gate electrode 1G, gate electrode MPR4 and gate electrode MPR0 formed in each of two element formation regions 80 are arranged at the same pitch.

Dummy gate electrode DG and the gate electrodes of the transistors included in replica resistor RPR are formed so as to extend in the row direction and located at the same pitch in the column direction. In other words, even if replica resistors RPR are arranged in the row direction together with memory cell arrays ARY each having memory cells arranged in the number of rows of basic unit m, the continuity of patterned arrangement of replica resistors RPR is maintained, and the value of each replica resistor RPR is maintained at a fixed value. Consequently, the accuracy of negative bias reference voltage RPLV determined by the number of replica resistors RPR connected in parallel and the value of reference resistor RREF is ensured.

Figure 13:
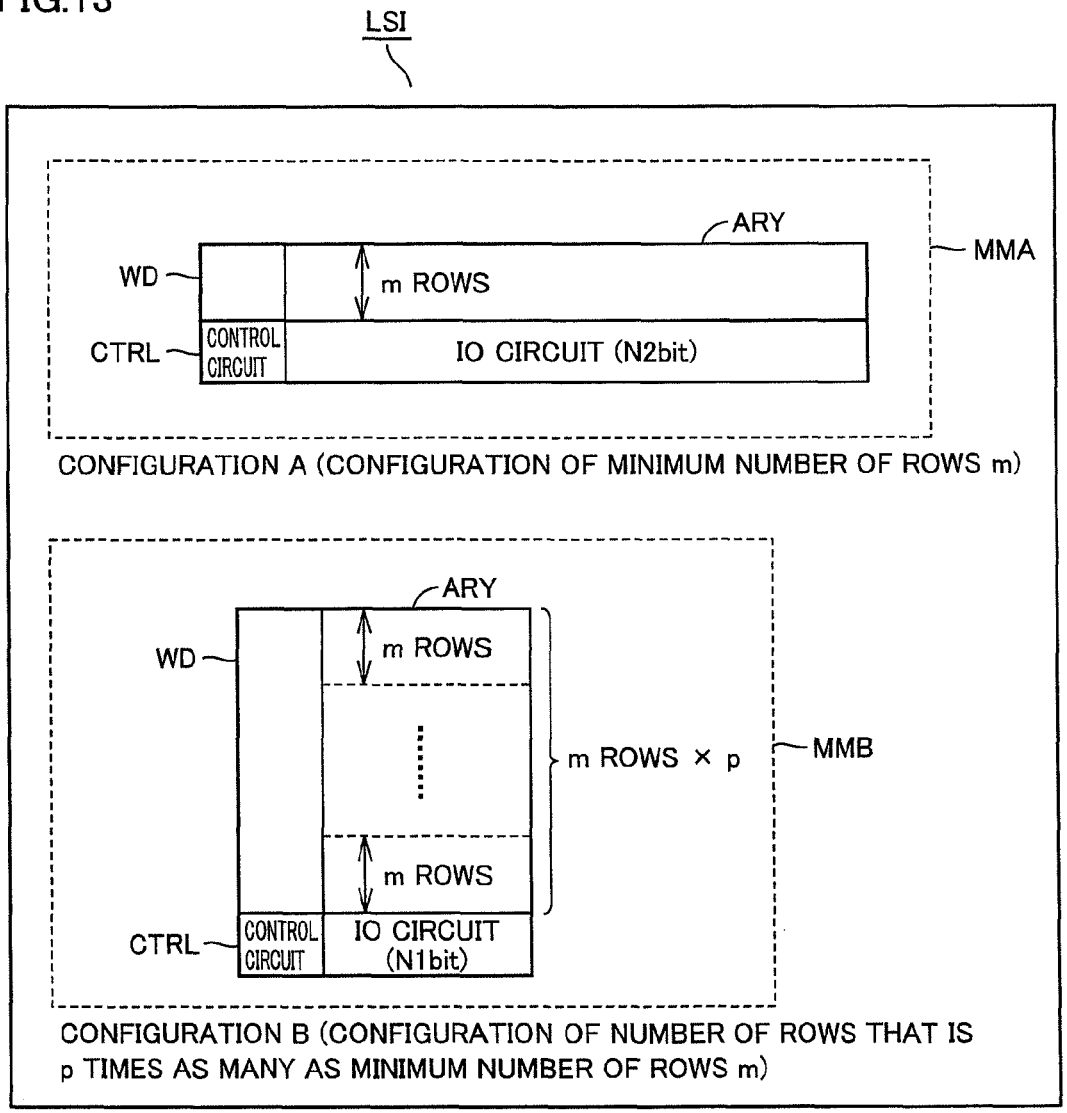
FIG. 13 is a configuration diagram of two memory macros generated by the memory compiler included in the semiconductor device according to the first embodiment.
Figure 14:
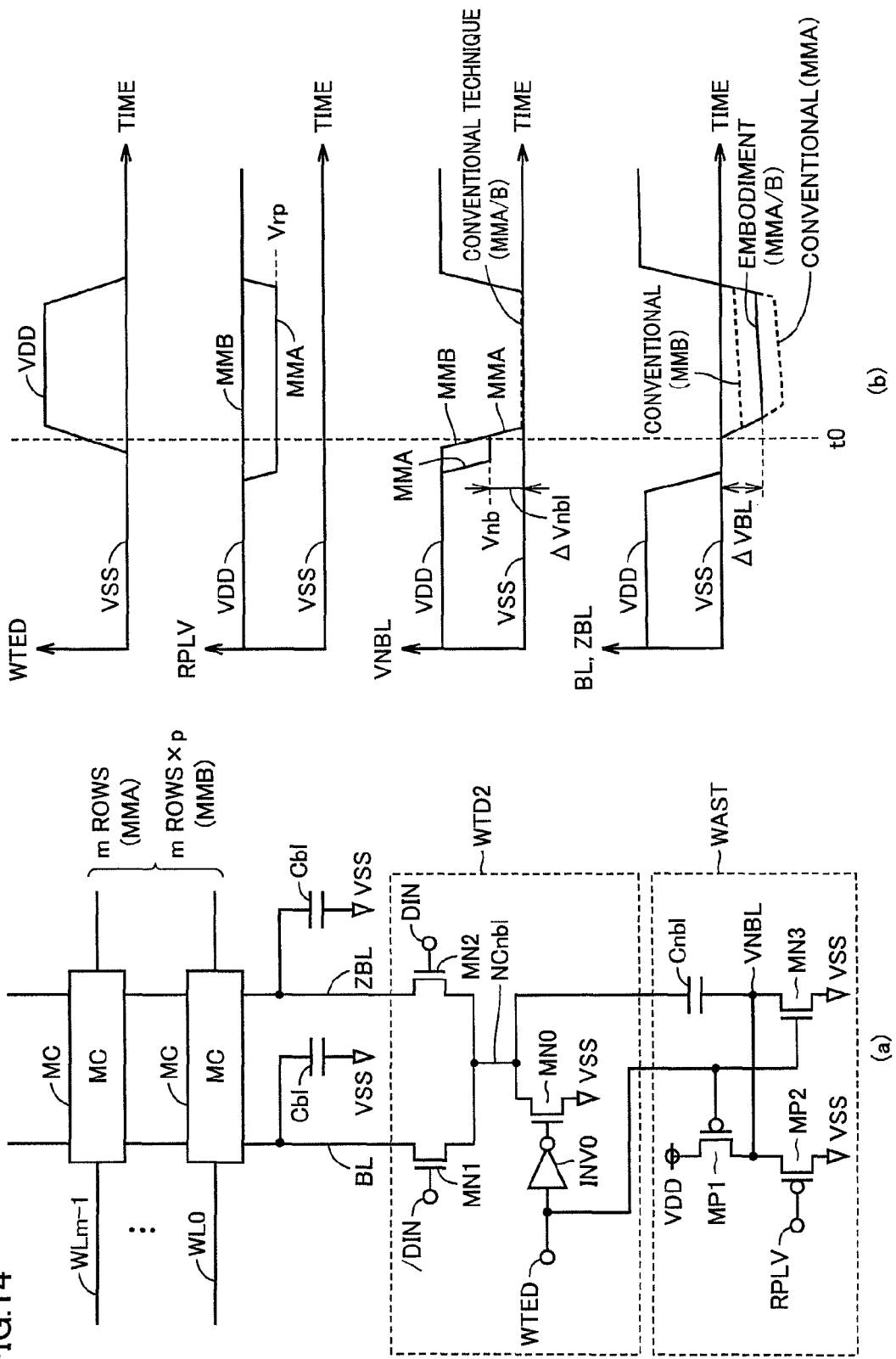
FIG. 14 is a diagram illustrating the configuration and the operation of the negative bias voltage generation circuit in each of two memory macros shown in FIG. 13.
Figure 15:
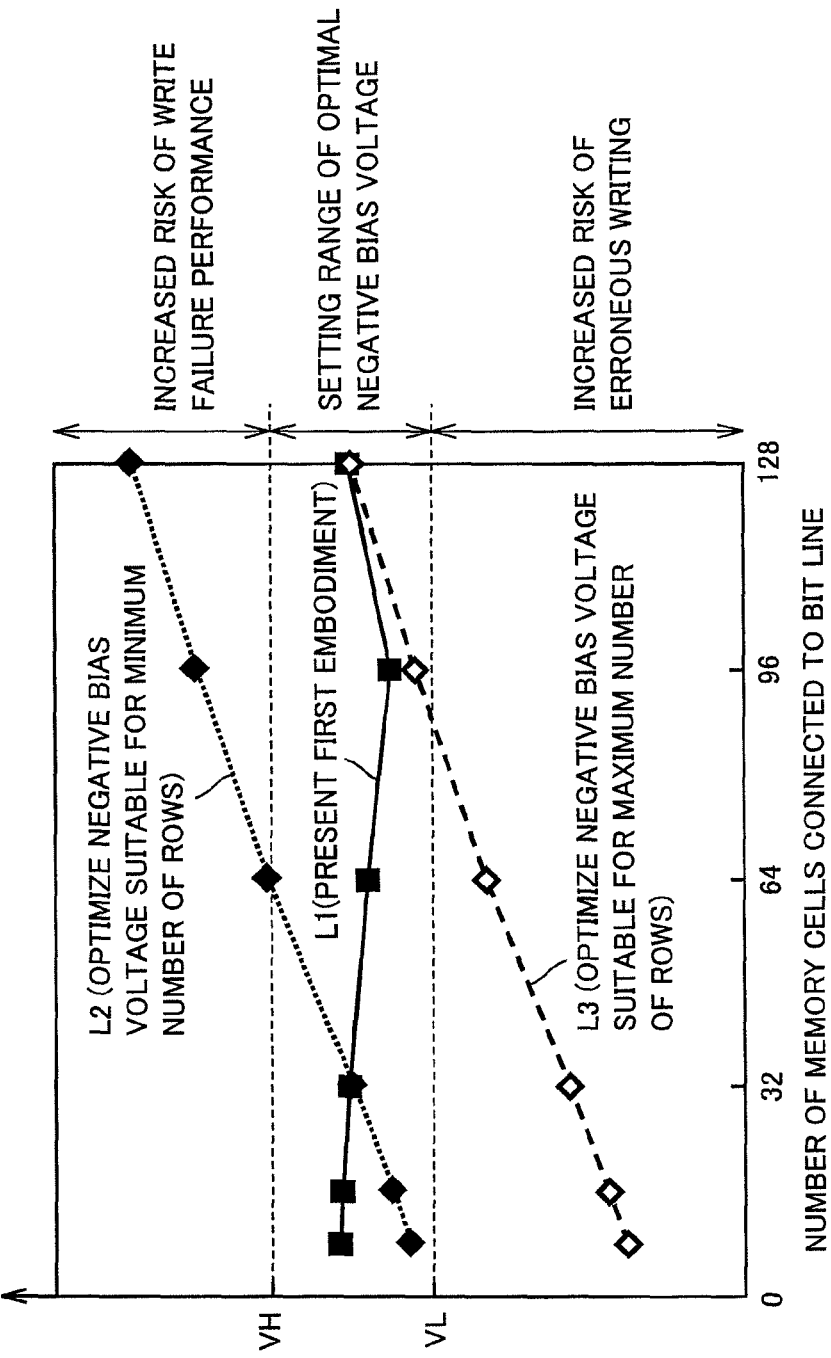
FIG. 15 is a diagram illustrating the effect of the semiconductor device according to the first embodiment.

Referring to FIGS. 13, 14 and 15, the effect of semiconductor device LSI according to the first embodiment will then be described.

FIG. 13 shows a memory macro MMA having a configuration A and a memory macro MMB having a configuration B that are generated by the memory compiler and included in semiconductor device LSI according to the first embodiment. Memory macro MMA includes memory cells in m rows of a basic unit and has an IO width of N2 bit. Memory macro MMB includes memory cells arranged in the number of rows that is p times as many as m rows of a basic unit, and has an IO width of N1 bit.

FIG. 14 is a diagram illustrating the configuration and the operation of negative bias voltage generation circuit WAST in each of memory macro MMA and memory macro MMB shown in FIG. 13.

FIG. 14(a) shows circuit diagrams of negative bias voltage generation circuit WAST and write driver rear stage unit WTD2 corresponding to those in FIG. 7, and memory cells MC. In FIG. 14(a), column selection circuit YSW is not shown and write driver rear stage unit WTD2 is configured to control the voltage on one pair of bit lines BL/ZBL. In memory macro MMA having configuration A, memory cells MC connected to a pair of bit lines BL/ZBL are arranged in m rows (m memory cells). In memory macro MMB having configuration B, the number of memory cells MC connected to a pair of bit lines BL/ZBL is p (p is an integer of 2 or more) times m rows. Bit line BL and bit line ZBL each have load capacitance Cbl. Load capacitance Cbl in memory macro MMB is p times as high as load capacitance Cbl in memory macro MMA.

On the other hand, write driver rear stage unit WTD2 and negative bias voltage generation circuit WAST have the same circuit configuration both in memory macro MMA and memory macro MMB. Therefore, the capacitance value of capacitance element Cnbl in negative bias voltage generation circuit WAST is set at the same value irrespective of the value of load capacitance Cbl on bit line BL/ZBL.

FIG. 14(b) is a timing diagram illustrating the operation of negative bias voltage generation circuit WAST in each of memory macro MMA and memory macro MMB.

Before time t0, in memory macro MMA, negative bias reference voltage RPLV is changed from power supply voltage VDD to voltage Vrp, and the voltage on electric charge amount adjustment node VNBL is changed from power supply voltage VDD to voltage Vnb (see FIG. 8). On the other hand, in memory macro MMB, negative bias reference voltage RPLV is maintained at power supply voltage VDD. This is because, in memory macro MMB, p replica resistors RPR included in negative bias reference voltage generation unit VBADJ are connected in parallel (see FIG. 7), which causes negative bias reference voltage RPLV to be increased approximately to powers supply voltage VDD.

When control signal WTED changes from a low level to a high level at time t0, in memory macro MMA, the voltage on electric charge amount adjustment node VNBL is decreased from voltage Vnb by bias voltage ΔVnbl and reaches power supply voltage VSS. On the other hand, in memory macro MMB, the voltage on electric charge amount adjustment node VNBL is decreased from power supply voltage VDD to power supply voltage VSS (ΔVnbl=VDD). This voltage drop on electric charge amount adjustment node VNBL at one end of capacitance element Cnbl appears as a voltage drop at the other end of capacitance element Cnbl. Furthermore, the other end of capacitance element Cnbl is set at power supply voltage VSS. Accordingly, on bit line ZBL connected to n type transistor MN2 that is brought into a conduction state in write driver rear stage unit WTD2, the voltage is decreased from power supply voltage VSS in the negative voltage direction by negative bias voltage ΔVBL.

The relation represented by the following equation 2 lies between bias voltage ΔVnbl and negative bias voltage ΔVBL.

$$\Delta VBL = Cnbl/(Cnbl+Cbl) * \Delta Vnbl \quad \text{Equation 2}$$

The amount of accumulated electric charge in capacitance element Cnbl is set such that desired negative bias voltage ΔVBL can be obtained in memory macro MMA having memory cells arranged in m rows as a basic unit. While load capacitance Cbl on the bit line in memory macro MMB is p times as high as load capacitance Cbl in memory macro MMA, bias voltage ΔVnbl in equation 2 is equal to power supply voltage VDD. By this increase in bias voltage ΔVnbl (an increase in the amount of accumulated electric charge in capacitance element Cnbl), the same negative bias voltage ΔVBL as that on the bit line in memory macro MMA is achieved also on the bit line in memory macro MMB (see the graph showing a change in BL/ZBL in FIG. 14 (b)).

In the graph showing a change in bit line BL/ZBL in FIG. 14(b), dashed lines show the case where, in each memory macro having a different configuration, the voltage on electric charge amount adjustment node VNBL is not adjusted in accordance with the number of rows of memory cells, but maintained at a fixed value. In this case, the voltage on electric charge amount adjustment node VNBL in each of memory macro MMA and memory macro MMB is lowered from power supply voltage VDD to power supply voltage VSS. Consequently, in memory macro MMA in which the load capacitance on bit line BL/ZBL is relatively small, negative bias voltage ΔVBL is increased above an optimal value, and the voltage on bit line BL/ZBL is lowered to an excessively negative voltage. Furthermore, in memory macro MMB in which the load capacitance on bit line BL/ZBL is relatively large, negative bias voltage ΔVBL is lowered below an optimal value, and the negative voltage on bit line BL/ZBL is not sufficiently lowered.

Referring to FIGS. 14(a) and 5, the effect on memory cells MC that is caused by excessive or insufficient negative bias voltage ΔVBL will then be described. In FIG. 14(a), during the write cycle, among m memory cells MC connected to bit line BL/ZBL selected in column selection circuit YSW (memory macro MMA) or m×p memory cells (memory macro MMB), the target into which data is to be written is a memory cell MC connected to word line WL0 set at a high level, and the target into which data is not to be written is a memory cell MC connected to word line WLm−1 set at a low level.

Referring to FIG. 5, an explanation will be given about the operation of memory cell MC regarded as a target into which data is to be written, in the case where negative bias voltage ΔVBL is smaller than an optimal value. The voltage on bit line ZBL is lowered from power supply voltage VSS in the negative voltage direction by negative bias voltage ΔVBL while the voltage on bit line BL is maintained at power supply voltage VDD. N type transistor PG_R has a gate applied with the voltage on word line WL set at a high level, and a source applied with the voltage lowered from power supply voltage VSS by negative bias voltage ΔVBL. When negative bias voltage ΔVBL is an appropriate value, n type transistor PG_R causes an immediate drop of the voltage on memory node Nd_R to which its drain is connected, to thereby invert the high-level data held in memory node Nd_R before writing to a low level. When negative bias voltage ΔVBL is smaller than an appropriate value, it becomes difficult for n type transistor PG_R to invert the level of memory node Nd_R due to insufficient driving capability, which increases the risk of write failure.

Hereinafter described will be the operation of memory cell MC into which data is not to be written, in the case where negative bias voltage ΔVBL is greater than an optimal value. Also in this case, the voltage on bit line ZBL is lowered from power supply voltage VSS by negative bias voltage ΔVBL in the negative voltage direction while the voltage on bit line BL is maintained at power supply voltage VDD. N type transistor PG_R has a gate applied with the voltage on word line WL set at a low level, and a source applied with the voltage lowered from power supply voltage VSS by negative bias voltage ΔVBL. When negative bias voltage ΔVBL is an optimal value, a voltage exceeding its threshold voltage is not applied between the source and the drain of n type transistor PG_R, thereby allowing protection of the data held in memory cell MC into which data is not to be written. When negative bias voltage ΔVBL is greater than an optimal value, n type transistor PG_R is brought into a conduction state, which brings about erroneous writing that causes inversion of the data held in memory node Nd_R.

Referring to FIG. 15, the effect of semiconductor device LSI according to the first embodiment will then be described.

In FIG. 15, the horizontal axis shows the number of memory cells MC connected to bit line BL/ZBL, and the vertical axis shows the negative bias voltage applied to bit line BL/ZBL in an arbitrary unit. Line graph L1 shows a change in the negative bias voltage in semiconductor device LSI according to the first embodiment. Irrespective of the number of rows of memory cells MC in the memory cell array, that is, the number of memory cells MC connected to bit line BL/ZBL, negative bias voltage ΔVBL applied to bit line BL/ZBL is set to fall within an appropriate range indicated by a lower limit voltage value VL to an upper limit voltage value VH. This is because the amount of accumulated electric charge in accordance with the load capacitance on bit line BL/ZBL is set at capacitance element Cnbl by negative bias reference voltage generation unit VBADJ and negative bias voltage generation circuit WAST.

On the other hand, line graphs L2 and L3 each show a comparative example in the case where a fixed amount of accumulated electric charge is set for the capacitance element irrespective of the load capacitance on the bit line, unlike semiconductor device LSI according to the first embodiment. Line graph L2 shows an example in the case where the bit line having increased number of rows is also supplied with the accumulated electric charge of the capacitance element that generates a negative bias voltage suitable to the bit line to which memory cells arranged in the minimum number of rows set by the memory compiler are connected. As the number of memory cells connected to the bit line is increased, the negative bias voltage applied to the bit line becomes insufficient (the voltage on the bit line becomes close to power supply voltage VSS). Then, when the value exceeds upper limit voltage value VH, the risk of write failure is increased. Line graph L3 shows an example in the case where the bit line having the decreased number of rows is also supplied with the amount of accumulated electric charge of the capacitance element that generates a negative bias voltage suitable to the bit line to which memory cells arranged in the maximum number of rows set by the memory compiler are connected. As the number of memory cells connected to the bit line is decreased, an excessive negative bias voltage is applied to the bit line (the voltage is excessively lowered from power supply voltage VSS in the negative voltage direction). Then, when the value is decreased below lower limit voltage value VL, the risk of erroneous writing is increased.

According to semiconductor device LSI in accordance with the first embodiment, in the memory macro having a plurality of memory macros that are different in the number of rows, data witting can be performed in the negative bit line scheme by negative bias voltage ΔVBL set at an optimal value for each memory macro.

<Second Embodiment>

Figure 16:
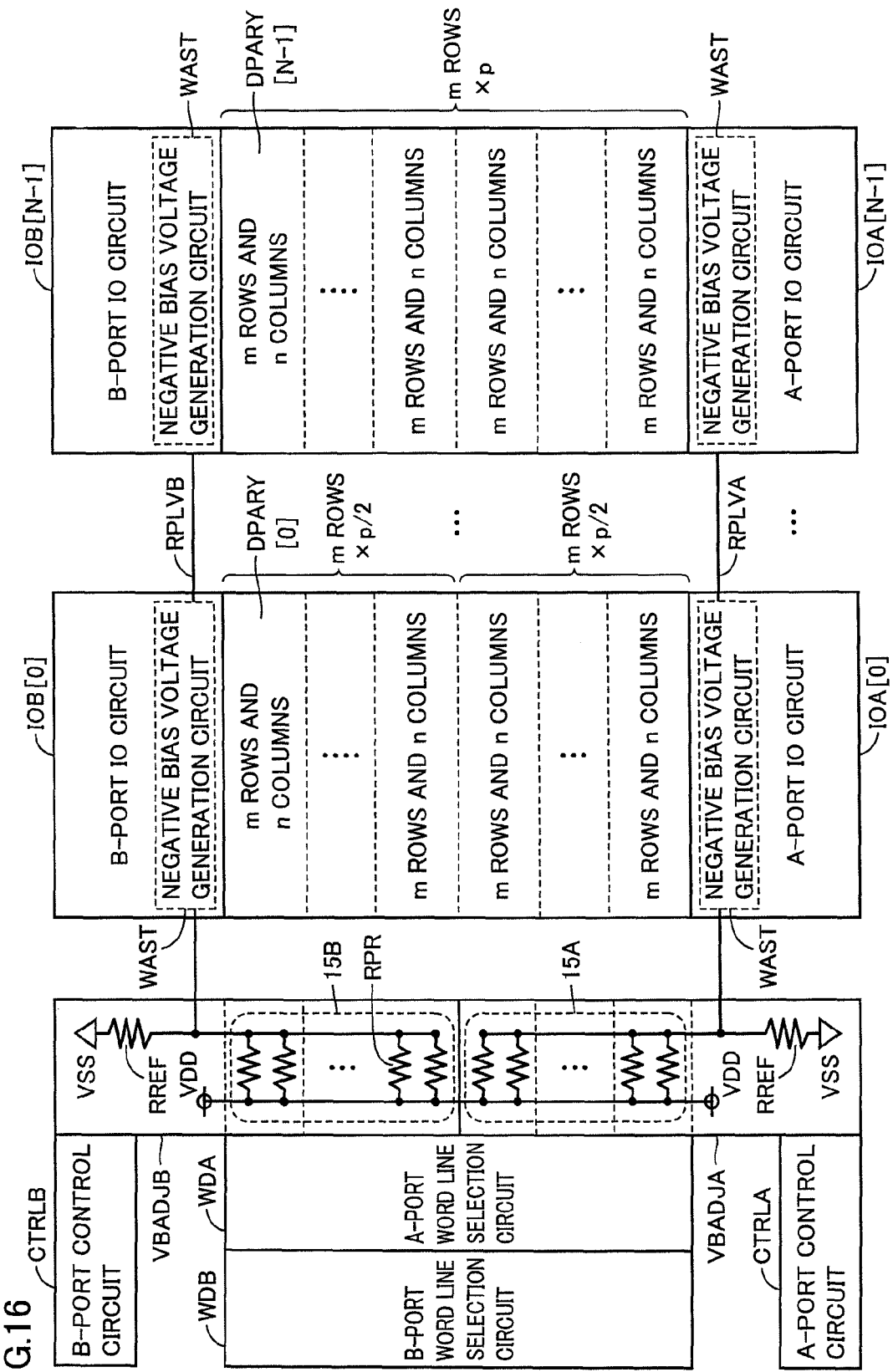
FIG. 16 is a configuration diagram of a memory macro included in a semiconductor device according to the second embodiment.

Referring to FIG. 16, the configuration of the memory macro included in semiconductor device LSI according to the second embodiment will then be described.

FIG. 16 shows a configuration of a memory macro having a plurality of memory cell arrays DPARY[0] to DPARY[N−1] (each memory cell array may also be hereinafter referred to as a "DPARY") each formed of a dual port memory cell. The memory macro has a configuration in which memory cell arrays DPARY each having p memory cell arrays of m rows and n columns arranged in the bit line direction are arranged in the word line direction by an IO width of N bits. On both ends of each memory cell array DPARY in the bit line direction, there are an A-port IO circuit IOA having negative bias voltage generation circuit WAST and a B-port IO circuit IOB having negative bias voltage generation circuit WAST, respectively. The negative bias voltage generation circuit at each port is disposed adjacent to memory cell array DPARY.

A negative bias reference voltage generation unit VBADJA is formed of a reference resistor RREF and an A-port replica resistor group 15A including a plurality of replica resistors RPR. A-port replica resistor group 15A is formed of p replica resistors RPR arranged for each of p memory cell arrays each having memory cells arranged in p rows and n columns, and arranged on the side adjacent to A-port IO circuit IOA in the region corresponding to half the length of memory cell array DPARY[0] in the bit line direction. P replica resistors RPR of A-port replica resistor group 15A are connected in parallel, one end of which is applied with power supply voltage VDD and the other end of which is connected to one end of reference resistor RREF. Reference resistor RREF has the other end applied with power supply voltage VSS. Negative bias reference voltage generation unit VBADJA divides the voltage between power supply voltage VSS and power supply voltage VDD by A-port replica resistor group 15A and reference resistor RREF connected in series, and outputs the obtained value to negative bias voltage generation circuit WAST as a negative bias reference voltage RPLVA.

Negative bias reference voltage generation unit VBADJB is formed of a reference resistor RREF and a B-port replica resistor group 15B including a plurality of replica resistors RPR. B-port replica resistor group 15B is formed of p replica resistors RPR arranged for each of p memory cell arrays each having memory cells arranged in m rows and n columns, and arranged on the side adjacent to B-port IO circuit IOB in the region corresponding to half the length of memory cell array DPARY[0] in the bit line direction. P replica resistors RPR of B-port replica resistor group 15B are connected in parallel, one end of which is applied with power supply voltage VDD and the other end of which is connected to one end of reference resistor RREF. Reference resistor RREF has the other end applied with power supply voltage VSS. Negative bias reference voltage generation unit VBADJB divides the voltage between power supply voltage VSS and power supply voltage VDD by B-port replica resistor group 15B and reference resistor RREF connected in series, and outputs the obtained value to negative bias voltage generation circuit WAST as a negative bias reference voltage RPLVB.

An A-port word line selection circuit WDA and a B-port word line selection circuit WDB are disposed adjacent to A-port replica resistor group 15A and B-port replica resistor group 15B. An A-port control circuit CTRLA is disposed adjacent to reference resistor RREF for the A port while a B-port control circuit CTRLB is disposed adjacent to reference resistor RREF for the B port. Based on negative bias reference voltage RPLVA, negative bias voltage generation circuit WAST at the A port generates negative bias voltage ΔVBL that is to be applied to the A-port bit line of memory cell array DPARY. Similarly, based on negative bias reference voltage RPLVB, negative bias voltage generation circuit WAST at the B port generates negative bias voltage ΔVBL that is to be applied to the B-port bit line of memory cell array DPARY.

In the case where memory cell array DPARY has a configuration in which p memory cell arrays each having memory cells arranged in m rows of a basic unit are arranged in the bit line direction, replica resistors RPR corresponding to the memory cell arrays of each basic unit are arranged in the column direction at half the pitch at which the memory cell arrays are arranged in the column direction, so that replica resistors RPR for the A port and the B port can be arranged in one column in the bit line direction. By arranging replica resistors RPR in one column in this way, it becomes possible to suppress an increase in the area of the memory macro formed of a dual port memory. Furthermore, by continuously arranging replica resistors RPR for the A and B ports at regular intervals, the characteristics of transistors forming a replica resistor RPR at each port are maintained uniformly, so that negative bias voltage ΔVBL having a desired value can be generated irrespective of the configuration of the memory macro.

Even if the memory cell included in the memory macro is of a multi-port type such as a 3-port type, a 4-port type or more, replica resistors RPR can be arranged in one column by reducing the pitch of arranging replica resistors RPR in accordance with the number of ports. When the number of transistors connected in parallel and forming replica resistor RPR is decreased in accordance with reduction in the arrangement pitch, replica resistors RPR can still be arranged in one column by increasing the gate width of each transistor as appropriate to lower the on-resistance value of each transistor.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a first memory macro having memory cells arranged in a first number of rows; and
   a second memory macro having memory cells arranged in a second number of rows, said first memory macro including
- a first bit line connected to said memory cells,
- a first negative bias voltage generation circuit generating a first negative bias voltage that is to be applied to said first bit line during writing, and
- a first negative bias reference voltage generation unit, and said second memory macro including
- a second bit line connected to said memory cells,
- a second negative bias voltage generation circuit generating a second negative bias voltage that is to be applied to said second bit line during writing, and
- a second negative bias reference voltage generation unit, wherein said first negative bias reference voltage generation unit generates a first negative bias reference voltage based on a first resistance ratio between a first resistor and a second resistor, and outputs the first negative bias reference voltage to a first negative bias reference interconnection, said second negative bias reference voltage generation unit generates a second negative bias reference voltage based on a second resistance ratio between a third resistor and a fourth resistor, and outputs the second negative bias reference voltage to a second negative bias reference interconnection, said first negative bias voltage generation circuit generates said first negative bias voltage based on said first negative bias reference voltage, said second negative bias voltage generation circuit generates said second negative bias voltage based on said second negative bias reference voltage, and said first resistance ratio is different from said second resistance ratio.

2. The semiconductor device according to claim 1, wherein
said first negative bias voltage generation circuit has a first capacitance element,
said second negative bias voltage generation circuit has a second capacitance element,
said first capacitance element has one end electrically connected to said first bit line and the other end electrically connected to said first negative bias reference interconnection,
said second capacitance element has one end electrically connected to said second bit line and the other end electrically connected to said second negative bias reference interconnection,
an amount of accumulated electric charge of said first capacitance element is determined based on said first negative bias reference voltage, and
an amount of accumulated electric charge of said second capacitance element is determined based on said second negative bias reference voltage.

3. The semiconductor device according to claim 2, wherein
said second number of rows is greater than said first number of rows, and
the amount of accumulated electric charge of said second capacitance element is greater than the amount of accumulated electric charge of said first capacitance element.

4. The semiconductor device according to claim 3, wherein
said second resistor is equal in value to said fourth resistor, and
said third resistor is smaller in value than said first resistor.

5. The semiconductor device according to claim 4, wherein
a first ratio of the value of said first resistor to the value of said third resistor is equal to a second ratio of said second number of rows to said first number of rows.

6. The semiconductor device according to claim 2, wherein said first capacitance element is equal in capacitance value to said second capacitance element.

7. A semiconductor device comprising:
a memory macro including a memory cell array in which a predetermined array number of basic memory cell arrays each having memory cells arranged in a first number of rows are arranged in a column direction,
said memory macro including
- a bit line connected to said memory cells of said memory cell array,
- a negative bias voltage generation circuit generating a negative bias voltage that is to be applied to said bit line during writing, and
- a negative bias reference voltage generation unit, wherein based on a resistance ratio between a first resistor and a second resistor each formed of a predetermined array number of unit resistors, said negative bias reference voltage generation unit generates a negative bias reference voltage, and outputs the negative bias reference voltage to a negative bias reference interconnection, said negative bias voltage generation circuit includes a capacitance element having one end electrically connected to said negative bias reference interconnection and the other end electrically connected to said bit line, and an amount of accumulated electric charge of said capacitance element is determined based on said negative bias reference voltage.

8. The semiconductor device according to claim 7, wherein said predetermined array number of unit resistors are connected in parallel.

9. The semiconductor device according to claim 7, wherein said predetermined array number of unit resistors are arranged adjacent to said basic memory cell arrays in said column direction.

10. The semiconductor device according to claim 9, wherein an arrangement pitch of said unit resistors is identical to an arrangement pitch of said basic memory cell arrays.

11. The semiconductor device according to claim 10, wherein
said unit resistors each are formed of transistors, and
said transistors included in said first resistor have gate electrodes, respectively, that extend in a row direction and are arranged in said column direction at regular intervals.

12. A semiconductor device comprising
a memory macro including a memory cell array in which a predetermined array number of basic memory cell arrays each having multi-port memory cells arranged in a first number of rows are arranged in a column direction,
said memory macro including
- a first-port bit line and a second-port bit line connected to said multi-port memory cells of said memory cell array,
- a first-port negative bias voltage generation circuit generating a first negative bias voltage that is to be applied to said first-port bit line during writing,
- a second-port negative bias voltage generation circuit generating a second negative bias voltage that is to be applied to said second-port bit line during writing,
- a first-port negative bias reference voltage generation unit, and
- a second-port negative bias reference voltage generation unit, wherein based on a resistance ratio between a first resistor and a second resistor each formed of a predetermined array number of unit resistors, said first-port negative bias reference voltage generation unit generates a first-port negative bias reference voltage, and outputs the first-port negative bias reference voltage to a first-port negative bias reference interconnection, based on a resistance ratio between a third resistor and a fourth resistor each formed of said predetermined array number of said unit resistors, said second-port negative bias reference voltage generation unit generates a second-port negative bias reference voltage, and outputs the second-port negative bias reference voltage to a second-port negative bias reference interconnection, said first-port negative bias voltage generation circuit includes a first-port capacitance element having one end electrically connected to said first-port negative bias reference interconnection and the other end electrically connected to said first-port bit line, said second-port negative bias voltage generation circuit includes a second-port capacitance element having one end electrically connected to said second-port negative bias reference interconnection and the other end electrically connected to said second-port bit line, an amount of accumulated electric charge of said first-port capacitance element is determined based on said first-port negative bias reference voltage, and an amount of accumulated electric charge of said second-port capacitance element is determined based on said second-port negative bias reference voltage.

13. The semiconductor device according to claim 12, wherein said predetermined array number of said unit resistors at said first port and said predetermined array number of said unit resistors at said second port are arranged adjacent to said basic memory cell arrays in said column direction.

14. The semiconductor device according to claim 13, wherein said unit resistors at said first port and said unit resistors at said second port are arranged in the same column.

15. The semiconductor device according to claim 14, wherein an arrangement pitch of said unit resistors at said first port is identical to an arrangement pitch of said unit resistors at said second port.

\* \* \* \* \*

UNITED STATES PATENT AND TRADEMARK OFFICE
CERTIFICATE OF CORRECTION

| | | |
|---|---|---|
| PATENT NO. | : 9,171,595 B2 | Page 1 of 1 |
| APPLICATION NO. | : 13/935815 | |
| DATED | : October 27, 2015 | |
| INVENTOR(S) | : Hidehiro Fujiwara | |

It is certified that error appears in the above-identified patent and that said Letters Patent is hereby corrected as shown below:

IN THE SPECIFICATION
Column 4, Line 51: delete "anay" and insert -- array --
Column 4, Line 58: delete "anay" and insert -- array --
Column 4, Line 61: delete "anay" and insert -- array --
Column 4, Line 63: delete "anay" and insert -- array --
Column 5, Line  5: delete "anay" and insert -- array --
Column 5, Line 17: delete "anay" and insert -- array --
Column 7, Line 24: delete "MN" and insert -- MN0 --
Column 12, Line 35: delete "may" and insert -- array --

Signed and Sealed this
Twenty-ninth Day of March, 2016

Michelle K. Lee
*Director of the United States Patent and Trademark Office*